(12) United States Patent
Ito et al.

(10) Patent No.: US 12,626,776 B2
(45) Date of Patent: May 12, 2026

(54) SEMICONDUCTOR MEMORY DEVICE

(71) Applicant: Winbond Electronics Corp., Taichung City (TW)

(72) Inventors: Yutaka Ito, Yokohama (JP); Hitoshi Ikeda, Yokohama (JP)

(73) Assignee: WINBOND ELECTRONICS CORP., Taichung City (TW)

( * ) Notice: Subject to any disclaimer, the term of this patent is extended or adjusted under 35 U.S.C. 154(b) by 0 days.

(21) Appl. No.: 18/639,372

(22) Filed: Apr. 18, 2024

(65) Prior Publication Data

US 2024/0355404 A1     Oct. 24, 2024

(30) Foreign Application Priority Data

Apr. 20, 2023     (JP) .................................. 2023-069097

(51) Int. Cl.
G11C 29/08     (2006.01)
G11C 29/56     (2006.01)

(52) U.S. Cl.
CPC ........ G11C 29/08 (2013.01); G11C 29/56008 (2013.01)

(58) Field of Classification Search
CPC ... G11C 29/08; G11C 29/56008; G11C 29/40; G11C 29/44; G11C 29/52; G11C 16/26; G06F 11/1048

(Continued)

(56) References Cited

U.S. PATENT DOCUMENTS 6,499,121 B1 * 12/2002 Roy ................. G01R 31/31905
                                                          714/724
7,930,601 B2 * 4/2011 Eckelman ........ G11C 29/12015
                                                          714/719

(Continued)

FOREIGN PATENT DOCUMENTS

CN          103106148 A     5/2013
JP          51-87928 A     7/1976

(Continued)

OTHER PUBLICATIONS

Korean Office Action for Korean Application No. 10-2024-0048346, dated Dec. 18, 2024, with English translation.

*Primary Examiner* — Albert Decady
*Assistant Examiner* — Enam Ahmed
(74) *Attorney, Agent, or Firm* — Birch, Stewart, Kolasch & Birch, LLP

(57)          ABSTRACT

A semiconductor memory device includes an error bit detection unit and a bit counting unit. The error bit detection unit detects whether each bit in read data and each bit in expected data of the semiconductor memory device are consistent, and outputs the error bit data indicating pass/error information. The pass/error information indicates whether each detected bit is consistent. The bit counting unit counts the number of error bits in the error bit data indicating an inconsistency between the read data and the expected data, or counts the number of pass bits in the error bit data indicating consistency between the read data and the expected data. Furthermore, the semiconductor memory device also includes an interface for a read operation to input external expected values and an interface for the read operation interfaces to output the number of error bits or pass bits instead of the read data.

20 Claims, 17 Drawing Sheets

(58) Field of Classification Search
USPC ........................................................ 714/718
See application file for complete search history.

(56) References Cited

U.S. PATENT DOCUMENTS

| | | | | |
|---|---|---|---|---|
| 8,468,400 B2 * | 6/2013 | Feeley | ................... | G11C 29/38 |
| | | | | 714/736 |
| 10,937,517 B1 * | 3/2021 | Rich-Plotkin | .......... | G11C 29/40 |
| 2002/0016942 A1 | 2/2002 | MacLaren et al. | | |
| 2002/0042897 A1 * | 4/2002 | Klein | ..................... | G11C 29/56 |
| | | | | 714/718 |
| 2003/0222283 A1 * | 12/2003 | Takazawa | .............. | G11C 29/26 |
| | | | | 257/200 |
| 2012/0246527 A1 * | 9/2012 | Anzou | ................... | G11C 29/18 |
| | | | | 714/E11.169 |
| 2012/0314498 A1 * | 12/2012 | Feeley | ................... | G11C 29/38 |
| | | | | 365/185.09 |
| 2017/0263310 A1 | 9/2017 | Hung et al. | | |
| 2019/0377631 A1 * | 12/2019 | Hattori | ................. | G11C 13/004 |
| 2020/0136754 A1 * | 4/2020 | Hoermaier | ........... | H04L 1/0041 |

FOREIGN PATENT DOCUMENTS

| | | | |
|---|---|---|---|
| JP | 64-14797 | A | 1/1989 |
| JP | 9-33615 | A | 2/1997 |
| JP | 2001-236797 | A | 8/2001 |
| JP | 2002-197898 | A | 7/2002 |
| KR | 10-2002-0043378 | A | 6/2002 |
| TW | 202040583 | A | 11/2020 |

* cited by examiner

301

CUM

C<7:0>

COMP

CBC

BC

RD

PWRST first bit counting
time generation unit

LATC

RST

BCEN bit counting tree unit

311

313

PF<127:0>

SEMICONDUCTOR MEMORY DEVICE

CROSS REFERENCE TO RELATED APPLICATIONS

This application claims priority of Japanese Patent Application No. 2023-069097, filed on Apr. 20, 2023, the entirety of which is incorporated by reference herein.

BACKGROUND OF THE INVENTION

Field of the Invention

The present invention relates to semiconductor memory devices.

Description of the Related Art

In semiconductor memory devices, write data and read data are often inconsistent due to errors in their physical characteristics. Therefore, it is necessary to obtain relevant information about inconsistent data and to analyze or correct the semiconductor memory device accordingly. For example, an error bit counting device is configured to count the number of inconsistent bits (error bits) between the write data and the read data.

Patent document (Japanese Patent Application Publication No. 9-33615) discloses a memory defect analysis device (a semiconductor memory test device). The defective memory is divided into a plurality of blocks to shorten the amount of time required for error counting. Error bits are counted externally of the semiconductor memory, which is the target to be analyzed. However, depending on the situation, the memory defect analysis device is not able to obtain pass/error information of all bits of the semiconductor memory. In view of the above problem, the present invention is intended to provide a semiconductor memory device that includes an error bit counting device.

BRIEF SUMMARY OF THE INVENTION

A semiconductor memory device includes an error bit detection unit and a bit counting unit. The error bit detection unit detects whether each bit in read data and each bit in expected data of the semiconductor memory device are consistent, and outputs the error bit data indicating pass/error information. The pass/error information indicates whether each detected bit is consistent. The bit counting unit counts the number of error bits in the error bit data, which indicates that there is an inconsistency between the read data and the expected data, or counts the number of pass bits in the error bit data, which indicates that there is consistency between the read data and the expected data.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

Figure 1:
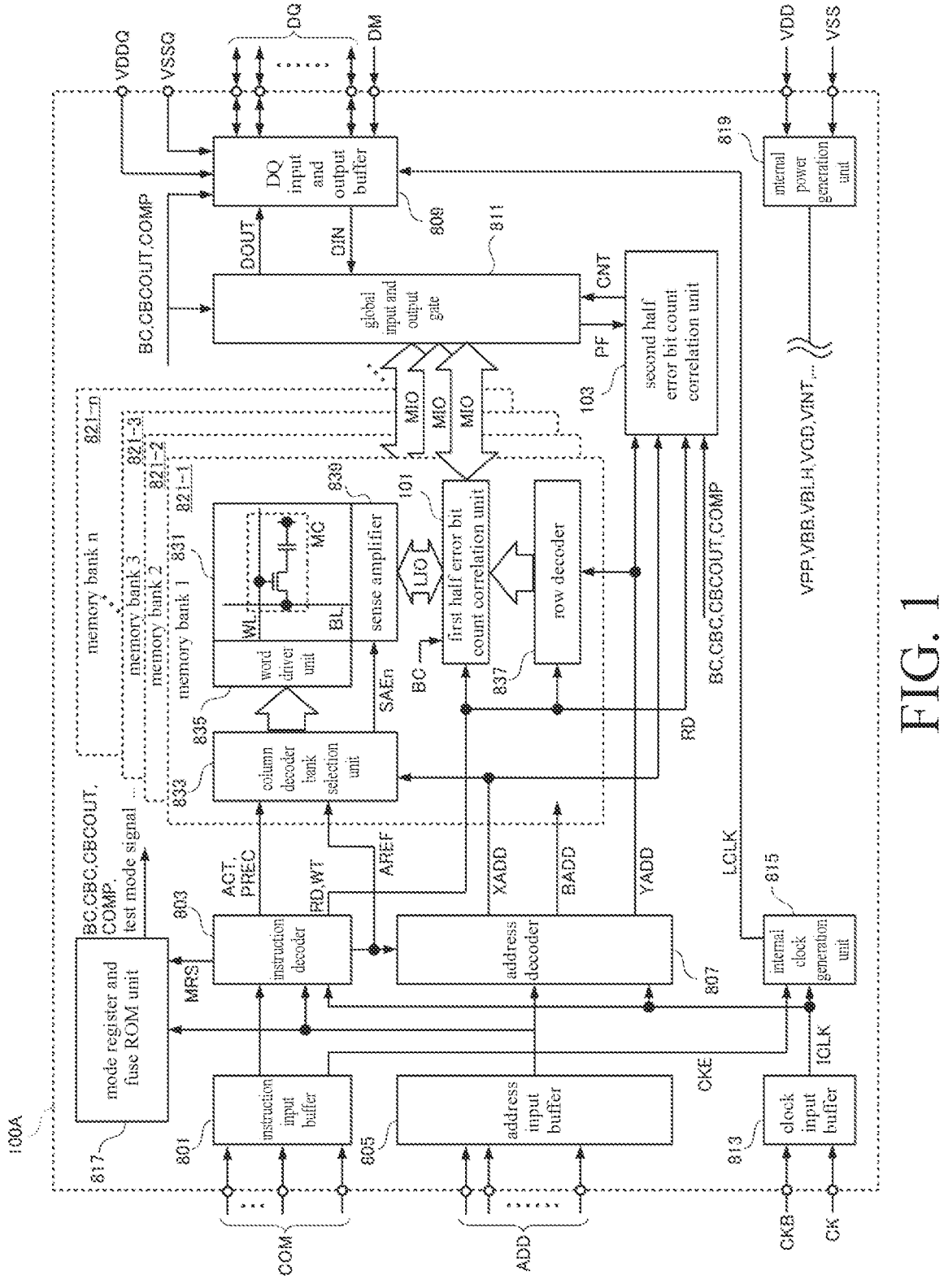
FIG. 1 is a block diagram illustrating a semiconductor memory device according to the first embodiment of the present invention.

FIG. 1 is a block diagram illustrating a semiconductor memory device 100A according to the first embodiment of the present invention. The semiconductor memory device 100A is a dynamic memory.

Referring to FIG. 1, the semiconductor memory device 100A includes an instruction input buffer 801, an instruction decoder 803, an address input buffer 805, an address decoder 807, a DQ input and output buffer 809, a global input and output gate 811, a clock input buffer 813, an internal clock generation unit 815, a mode register and fuse ROM unit 817 and an internal power generation unit 819.

In addition, the semiconductor memory device 100A includes memory banks 821-1~821-$n$. Each memory bank 821-$i$ (i=1, 2, 3 . . . , n) includes a memory cell 831, a column decoder bank selection unit 833, a word driver unit 835, a row decoder 837, a sense amplifier 839 and a first half error bit count correlation unit 101. Each memory bank 821-$i$ (i=1, 2, 3 . . . , n) is connected to the global input and output gate 811 via its corresponding memory input and output bus MIO. Furthermore, the semiconductor memory device 100A includes a second half error bit count correlation unit 103.

The instruction input buffer 801 is an input buffer for external instructions. The instruction decoder 803 decodes the instruction input from the instruction input buffer 801 and provides a signal indicating the decoding result to each unit of the semiconductor memory device 100A. The address input buffer 805 is an input buffer for external addresses. The address decoder 807 decodes the address input from the address input buffer 805 and provides signals indicating the decoding results to each unit of the semiconductor memory device 100A. The signal indicating the decoding result includes column address, row address and bank address. The DQ input and output buffer 809 is an input buffer for the external data DQ. The global input and output gate 811 is between the DQ input and output buffer 809 and the memory banks 821-1 to **821-*n*, and mainly performs data multiplexing and de-multiplexing for them. The clock input buffer 813 is an input buffer for an external clock. The internal clock generation unit 815 generates an internal clock based on the clock input from the clock input buffer 813 and distributes the internal clock to the inside of the semiconductor memory device 100A. The mode register and fuse ROM unit 817 generates a signal for controlling the semiconductor memory device 100A based on the decoding result of the instruction input from the instruction decoder 803 and the decoding result of the address input from the address input buffer 805, and provides the signal to the semiconductor memory device 100A. The internal power generation unit 819 generates internal power based on the external power, and provides the internal power to the inside of the semiconductor memory device 100A**.

Figure 2:
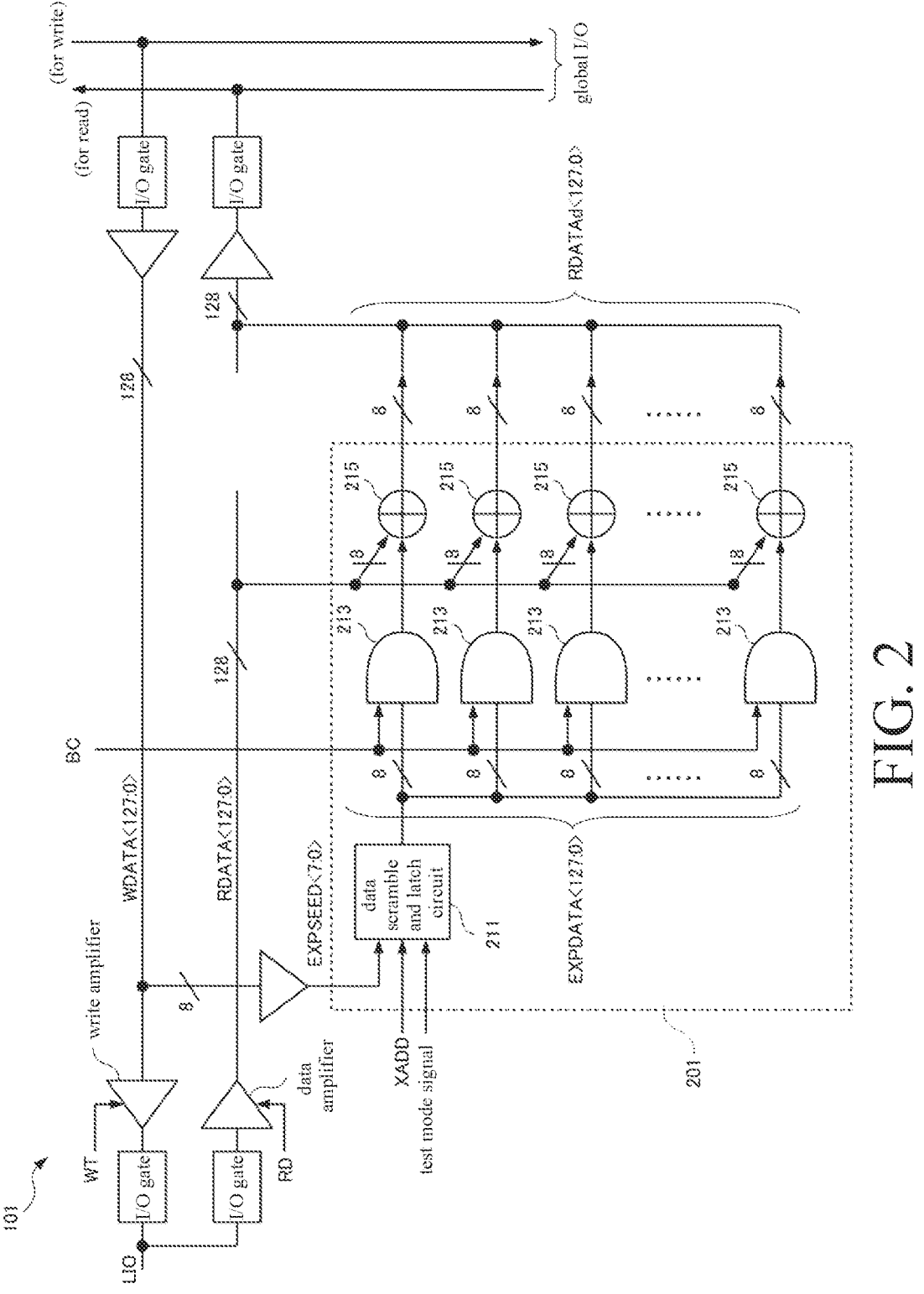
FIG. 2 is a circuit diagram illustrating the structure of the first half error bit count correlation unit.

The memory cell 831 includes two-dimensionally arranged memory cells MC arranged in the column direction and the row direction. The column decoder bank selection unit 833 decodes the column address and generates a column selection signal for selecting a column corresponding to the column address. The word driver 835 activates the word lines of the selected column. The row decoder 837 decodes the row address and generates a row selection signal for selecting the row corresponding to the row address. The sense amplifier 839 is set for each row, and the output of the sense amplifier 839 of the selected row is selected. FIG. 2 is a circuit diagram illustrating the structure of the first half error bit count correlation unit 101 shown in FIG. 1. The error bit detection unit 201 includes 16 XOR gate groups 215, and 16 AND gate groups 213. Each XOR gate group 215 includes eight 2-input-1-output XOR gates. Each AND gate group 213 includes eight 2-input-1-output AND gates. In addition, the error bit detection unit 201 includes a data scramble and latch circuit 211. The data scramble and latch circuit 211 corresponds to the "expected data preparation unit" in the present invention.

Each bit of the 8-bit write data WDATA<7:0> selected from the 128-bit write data WDATA<127:0> is provided to the data scramble and latch circuit 211 as the expected seed data EXPSEED<7:0>. Error bit counting is based on repeating the 8-bit write data WDATA<7:0> with a specific combination of logic levels 16 times to form the 128-bit expected data EXPDATA<127:0>.

In the each data scramble and latch circuit 211, when instructed by the test mode signal, the data scramble on the expected seed data EXPSEED<7:0> according to the column address XADD is enabled. When the data scramble is enabled by the test mode signal, the data scramble and latch circuit 211 generates EXPDATA<7:0> by maintaining or inverting the logic levels of each bit of the expected seed data EXPSEED<7:0> according to the column address XADD. The 128-bit expected data EXPDATA<127:0> is formed by repeating the expected seed data EXPSEED<7:0>16 times. On the one hand, the write data WDATA<127:0> returns as read data RDATA<127:0> when directly passing through the memory containing the memory cell. On the other hand, in the each data scramble and latch circuit 211, the write data WDATA<127:0> maintains or inverts the logic level according to the column address XADD. Therefore, each bit of the expected data EXPDATA<127:0> generated by the data scramble and latch circuit 211 becomes the correct logic level that is expected. The expected data EXPDATA<127:0> generated in this way is latched in the data scramble and latch circuit 211 for error bit counting. In addition, in the each data scramble and latch circuit 211, the data scramble is not enabled when not instructed by the test mode signal.

Therefore, when the each data scramble and latch circuit 211 is instructed by the test mode signal, it outputs the expected data EXPDATA<127:0> obtained by repeatedly scrambling the expected seed data EXPSEED<7:0> starting from the column address XADD. On the other hand, when the each data scramble and latch circuit 211 is not instructed by the test mode signal, it outputs the expected data EXP-DATA<127:0> obtained by repeating the expected seed data EXPSEED<7:0> without scrambling. In the first embodiment, whether the code is scrambled or not, the data output from the data scramble and latch circuit 211 is set as the so-called expected data EXPDATA<127:0>.

Totally 128 bits of expected data EXPDATA<127:0> output from the data scramble and latch circuit 211 are included in the first input terminals of all AND gates in all the AND gate groups 213. In general, the expected data EXPDATA<7:0> is provided to the first AND gate group 213, the expected data EXPDATA<15:8> is provided to the second AND gate group 213, . . . , and the expected data EXPDATA<127:120> is provided to the sixteenth AND gate group 213. In addition, in the error bit counting mode, the control signal BC with a level of high (HIGH) is generally provided to the second input terminals of all AND gates in all the AND gate groups 213. The output terminal of each AND gate in the each AND gate group 213 is included in the corresponding XOR gate group 215, and is provided to the first input terminal of the corresponding XOR gate.

The 128-bit read data RDATA is divided into 16 groups, each of which is 8 bits. Each bit of the 8-bit read data RDATA in each group is provided to the second input terminal of each XOR gate in each XOR gate group 215. Therefore, in the error bit counting mode, consistency between each bit of the 128-bit expected data EXP-DATA<127:0> and each bit of the 128-bit read data RDATA<127:0> from the 16 XOR gate groups 215 can be confirmed one by one. When the signal BC is HIGH, each bit of the data RDATAd<127:0>, which composed of the output of the 16 XOR gate group 215, has logic level indicating the consistency or inconsistency of the 128-bit expected data EXPDATA<127:0> with the 128-bit read data RDATA<127:0>. That is, the bit data RDATAd<i> (i=0~127) in the data RDATAd<127:0> indicates whether the bit data EXPDATA<i> in the expected data EXP-DATA<127:0> and the bit data RDATA<i> in the read data RDATA<127:0> are consistent. Therefore, when the signal BC is HIGH, the error bit with a level of HIGH among the bits of the data RDATAd<127:0> indicates that there is an inconsistency between the read data RDATA<127:0> and the expected data EXPDATA<127:0>.

In addition, in order to detect error bits, the write data WDATA to be written to a specific bit unit (cell) of a specific address of the memory is usually compared with the read data RDATA read from the cell. Accordingly, each time an error bit is detected, the bits of the read data RDATA must correctly correspond to the bits of the write data WDATA in each XOR gate in each XOR gate group 215. The data scramble and latch circuit 211 is controlled to correctly compare the bits of the read data RDATA and the corresponding bits of the write data WDATA in the XOR gate similarly. In other words, the data scramble and latch circuit 211 is controlled so that after the write data WDATA is converted into the expected data EXPDATA, the bit addresses and the bit combinations corresponding to the bits of converted from the expected data EXPDATA and those corresponding to the bits of the read data RDATA are consistent in clock in each XOR gate. The read data RDATA is the data input to the second terminal of each XOR gate in the XOR gate group 215. The write data WDATA is the data input to the first terminal of each XOR gate in the XOR gate group 215. Therefore, the data scramble and latch circuit 211 delays the write data WDATA for an appropriate time to output it as the expected data EXPDATA and compare it with the read data RDATA.

In addition, in modes other than the error bit counting mode, since the signal BC turns low (LOW), the data RDATAd<127:0>, which is composed of the outputs of the 16 XOR gate groups 215, is consistent with RDATA<127: 0>. That is, the data RDATAd<127:0> becomes the read data.

Referring to FIG. 1, the data RDATA<127:0> output from the error bit detection unit 201 in each memory bank 821-*i* (i=1, 2, 3 . . . , n) is input through the corresponding memory to the output bus MIO to be provided to the global input and output gate 811. In the error bit counting mode, the data RDATAd<127:0> from the currently selected memory bank 821-*i* (i=1, 2, 3 . . . , n), which is one of the memory banks 821-1~821-*n*, is provided to the second half error bit count correlation unit 103 as the error bit data PF<127:0>.

Figure 3:
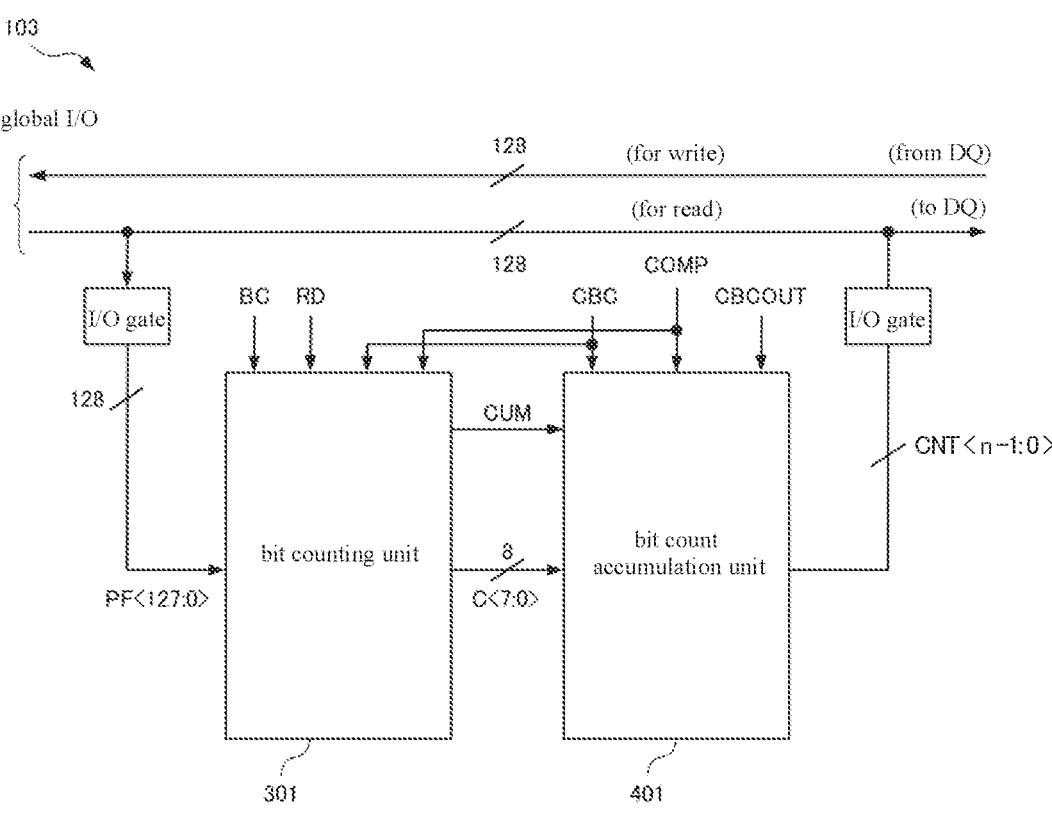
FIG. 3 is a block diagram illustrating the structure of the second half error bit count correlation unit.

FIG. 3 is a block diagram illustrating the structure of the second half error bit count correlation unit 103 shown in FIG. 1. The second half error bit count correlation unit 103 includes a bit counting unit 301 and a bit count accumulation unit 401.

The error bit data PF<127:0> from the global input and output gate 811 is input to the second half error bit count correlation unit 103. Here, in the error bit counting mode, the error bit data PF<127:0> is the data RDATAd<127:0> multiplexed between the memory banks 821-1~821-*n* in the memory input and output bus MIO. In addition, when the signal BC is HIGH, the data RDATAd<127:0> has a logical level indicating the consistency/inconsistency between the 128-bit expected data EXPDATA and the 128-bit read data RDATA.

Therefore, the error bit data PF<127:0> is input into the bit counting unit 301. The error bit data PF<127:0> is composed of 128-bit pass/error information. The 128-bit pass/error information has logic levels that indicate the consistency or inconsistency of each bit of the 128-bit expected data EXPDATA<127:0> with that of the 128-bit read data RDATA<127:0> (i.e., the logic levels that indicate whether each bit is an error bit). Among the 128 bits included in the error bit data PF<127:0>, the bits with a logic level of HIGH are error bits, and the bits with a logic level of LOW are pass bits. The bit counting unit 301 counts the number of error bits that indicate the inconsistency of logic level between the expected data EXPDATA and the read data RDATA based on the logic level of each bit of the error bit data PF<127:0>, and outputs the determined error bit number C<7:0> that indicates the number of error bits in binary. In addition, the bit counting unit 301 may also count the number of pass bits that indicate the consistency of the logic levels between the expected data EXPDATA and the read data RDATA based on the logic level of each bit of the error bit data PF<127:0>, and may output the determined pass bit number (not shown) that indicates the number of pass bits in binary.

The bit count accumulation unit 401 accumulates the number of error bits included in the determined error bit number C<7:0>, and outputs the accumulated value and so on externally as output data CNT<n−1:0>. In addition, the bit count accumulation unit 401 may accumulate the number of pass bits included in the determined pass bit number, and may output the accumulated value and so on externally as output data (not shown). Furthermore, the bit count accumulation unit 401 may output both the accumulated value of the error bits and the pass bits externally.

Figure 4:
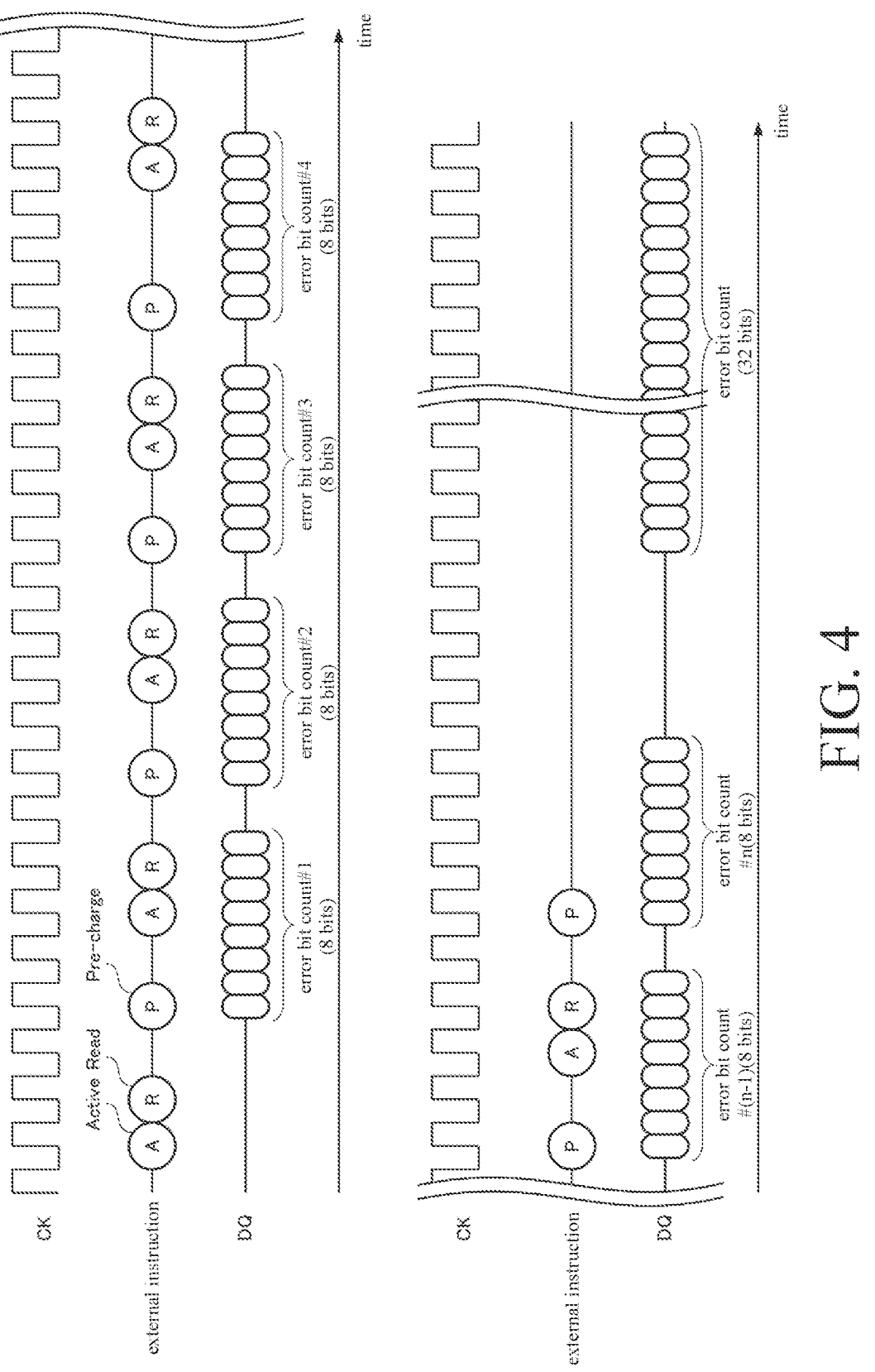
FIG. 4 is a time diagram illustrating an example operation of the semiconductor memory device according to the first embodiment of the present invention.

FIG. 4 is a time diagram illustrating an example operation of the semiconductor memory device according to the first embodiment of the present invention. In the error bit counting mode, the data from the terminal connected to the DQ input and output buffer 809 is served as the external data DQ. During the period from the operation of the 8-bit error bit counter #1 to that of the 8-bit error bit counter #n, the data is output from the semiconductor memory device, and the 32-bit error bit counter accumulates the number of output operations.

Figure 5:
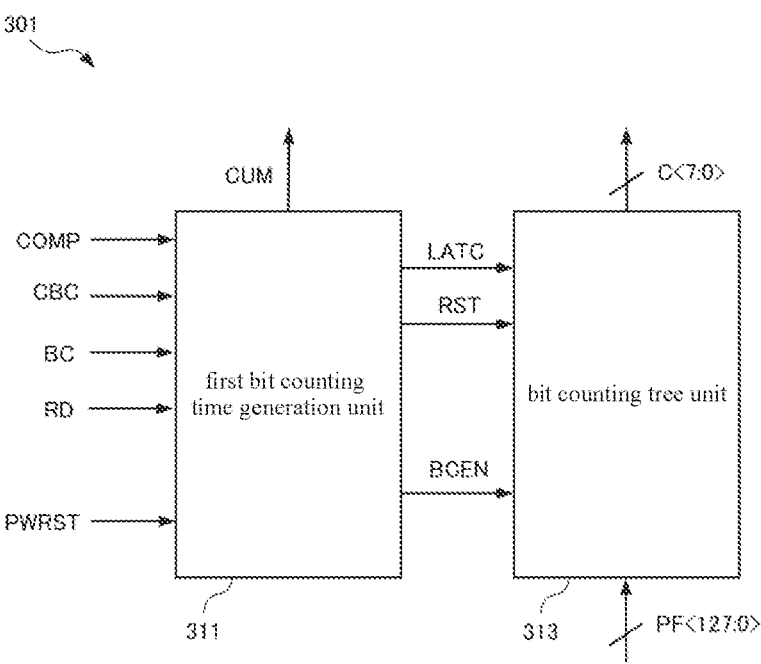
FIG. 5 is a block diagram illustrating an example structure #1 of the bit counting unit shown in FIG. 3 and FIG. 17.

FIG. 5 is a block diagram illustrating an example structure #1 of the bit counting unit 301 shown in FIG. 3. The bit counting unit 301 includes a first bit counting time generation unit 311 and a bit counting tree unit 313. The first bit count timing generating unit 311 generates a signal for operating the bit counting tree unit 313. The bit counting tree unit 313 inputs the error bit data PF<127:0>, and outputs the determined error bit number C<7:0>. That is, the bit counting tree unit 313 counts the number of error bits with a logic level of HIGH among the 128 bits of the error bit data PF<127:0>, and outputs the determined error bit number C<7:0> that indicates the number of error bits in binary.

Figure 6:
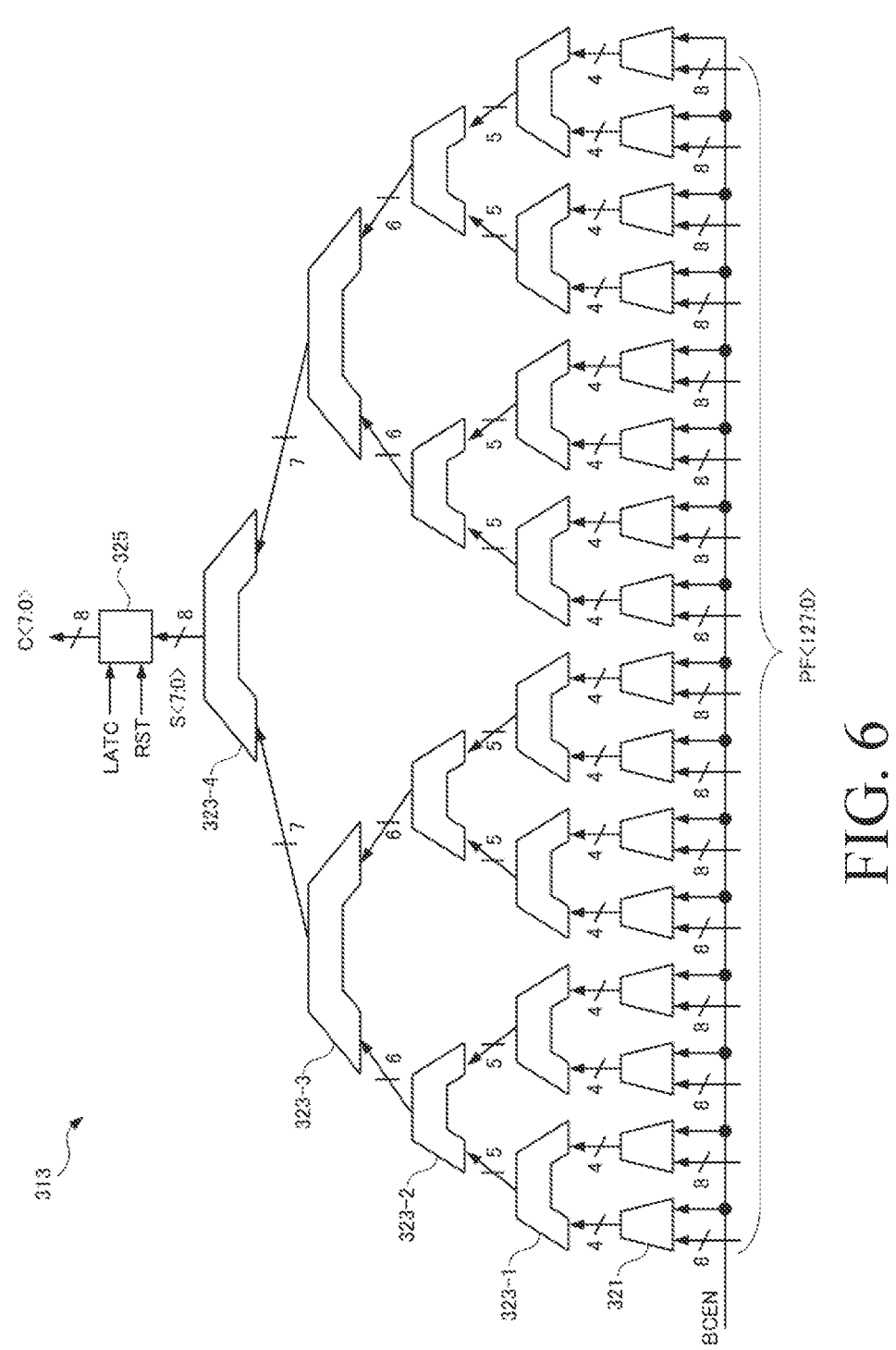
FIG. 6 is a circuit diagram illustrating the structure of the bit counting tree unit shown in FIG. 5.

FIG. 6 is a circuit diagram illustrating the structure of the bit counting tree unit 313 shown in FIG. 5. The bit counting tree unit 313, from bottom to top, includes sixteen sub-error bit counters 321, eight 4-bit adders 323-1, four 5-bit adders 323-2, two 6-bit adders 323-3, a 7-bit adder 323-4 and a latch circuit 325.

Each of the sixteen sub-error bit counters 321 counts a partial error bit number corresponding to the eight bits selected from the error bit data PF<127:0>, i.e., counts the number of bits with a logic level of HIGH corresponding to the inconsistency in the eight bits as the partial error bit number. Then, the partial error bit number is output as a 4-bit binary number.

Therefore, totally sixteen 4-bit binary data, which indicates the partial error bit number, for sixteen segments are output from the sixteen sub-error bit counter 321.

The control signal BCEN is input into the sixteen sub-error bit counter 321. The sub-error bit counter 321 operates only when the control signal BCEN is HIGH.

The determined error bit number S<7:0> represented by an 8-bit binary number can be obtained by adding the aforementioned partial error bit number in binary using the eight 4-bit adders 323-1, four 5-bit adders 323-2, two 6-bit adder 323-3 and 7-bit adder 323-4, which are connected in tree. That is, the eight 4-bit adders 323-1, four 5-bit adders 323-2, two 6-bit adder 323-3 and 7-bit adder 323-4 accumulate the partial error bit number to obtain the total number of error bits.

The latch circuit 325 latches the 8-bit data S<7:0> that indicates the error bit number output by the 7-bit adder 323-4 by the latch signal LATC, and outputs it as the determined error bit number C<7:0>. The determined error bit number C<7:0> latched by the latch circuit 325 is reset by the reset signal RST. Therefore, the latch circuit 325 outputs the determined error bit number C<7:0>, which is an 8-bit binary number indicating the number of error bits, during the period from when the latch signal LATC is input to when the reset signal RST is input.

Figure 7:
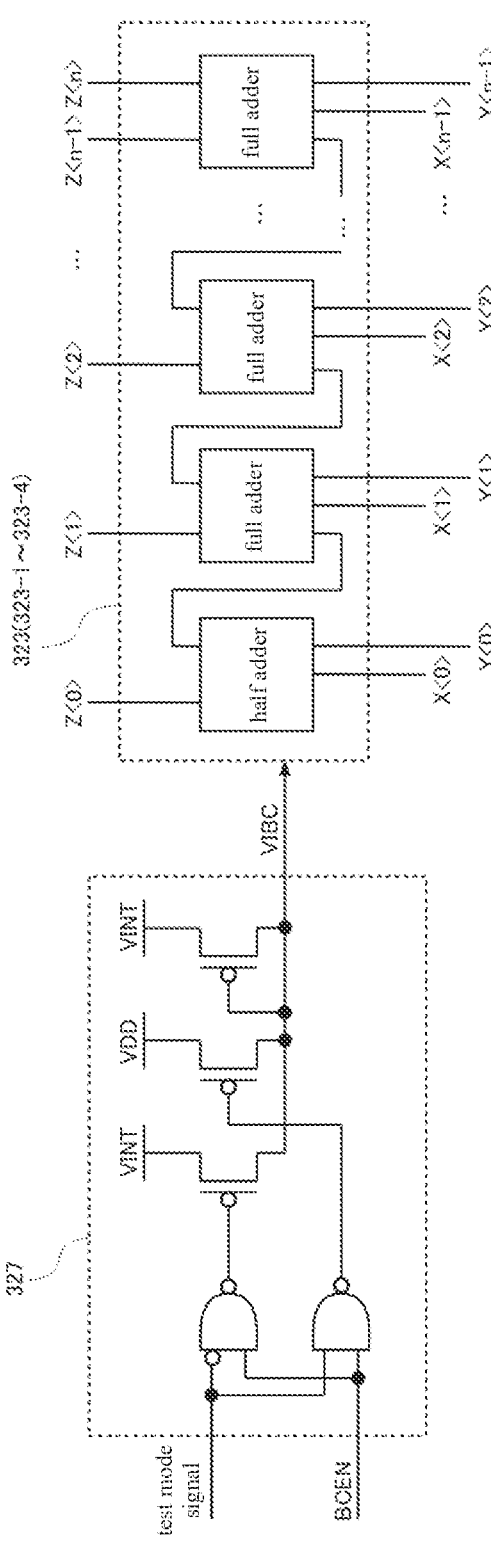
FIG. 7 shows the adders shown in FIG. 6

FIG. 7 shows the adders 323-1 to 323-4 shown in FIG. 6 and the power supply circuit (n-bit power supply unit for adders) 327 for supplying power to them. The power supply circuit 327 supplies the power selected according to the control signal BCEN between the external power supply VDD and the internal power supply VINT as the power supply VIBC for the n-bit adders 323-1 to 323-4. Specifically, in the bit counting mode, the control signal BCEN becomes HIGH, the external power supply VDD is selected as the power supply VIBC, and the n-bit adders 323-1 to 323-4 can perform normal operations. On the other hand, in modes other than the bit counting mode, the control signal BCEN becomes LOW and the internal power supply VINT is selected as the power supply VIBC, which saves the power.

Figure 8:
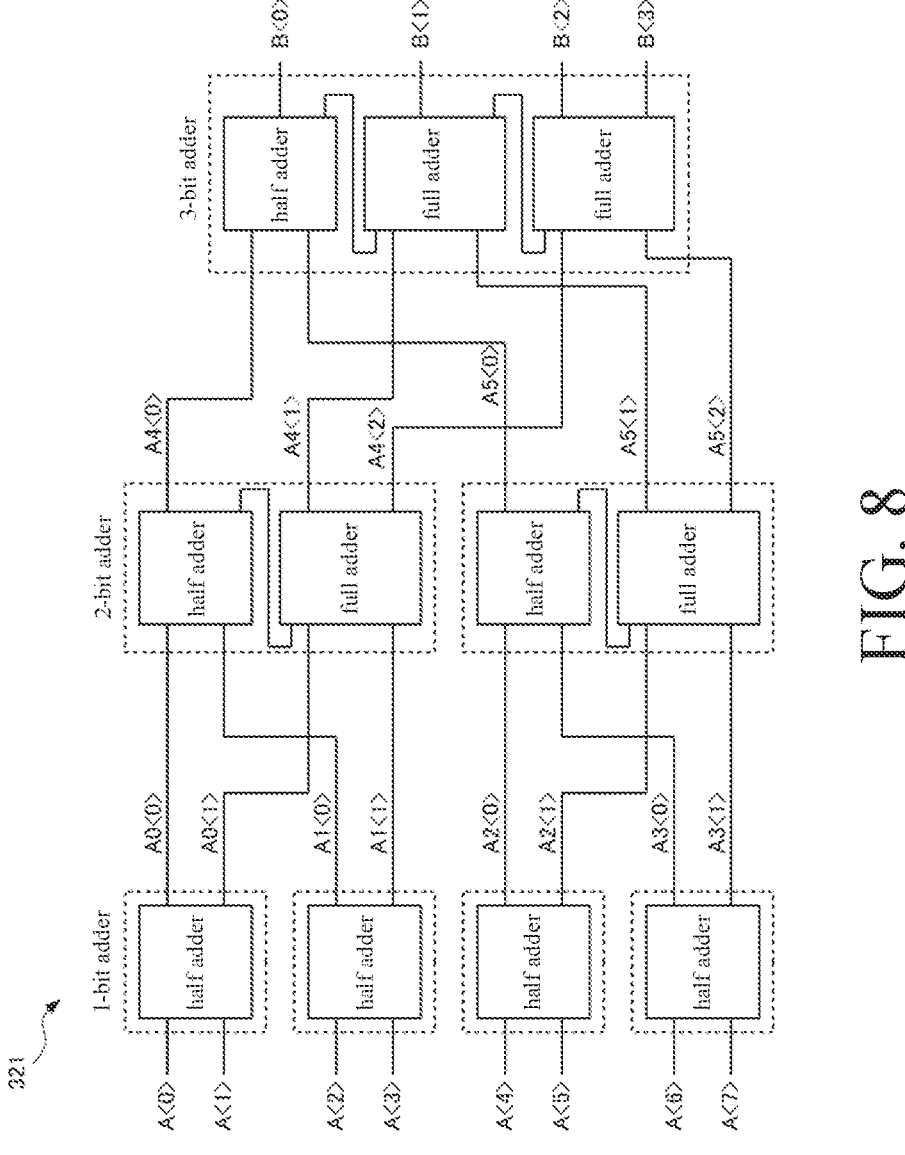
FIG. 8 is a circuit diagram of an example structure #1 of the sub-error bit counter shown in FIG. 6.

FIG. 8 is a circuit diagram of an example structure #1 of the sub-error bit counter 321 shown in FIG. 6. The sub-error bit counter 321 shown in FIG. 8 obtains the total number of 1-bit data with a level of HIGH among totally eight 1-bit data A<0> to A<7>, and outputs the partial error bit number as a 4-bit binary data B<3:0> consisting of B<0>, B<1>, B<2> and B<3>.

As shown in FIGS. 6 and 8, the partial error bit number PF<127:120> in the error bit data PF<127:0> becomes the input A<7:0> of the first sub-error bit counter. Similarly, the partial error bit number PF<119:112> becomes the input A<7:0> of the second sub-error bit counter. Similarly below, the partial error bit number PF<8×n+7:8×n> becomes the input A<7:0> of the (16−n)th sub-error bit counter (n=1, 2, 3, . . . , 16).

Figure 9:
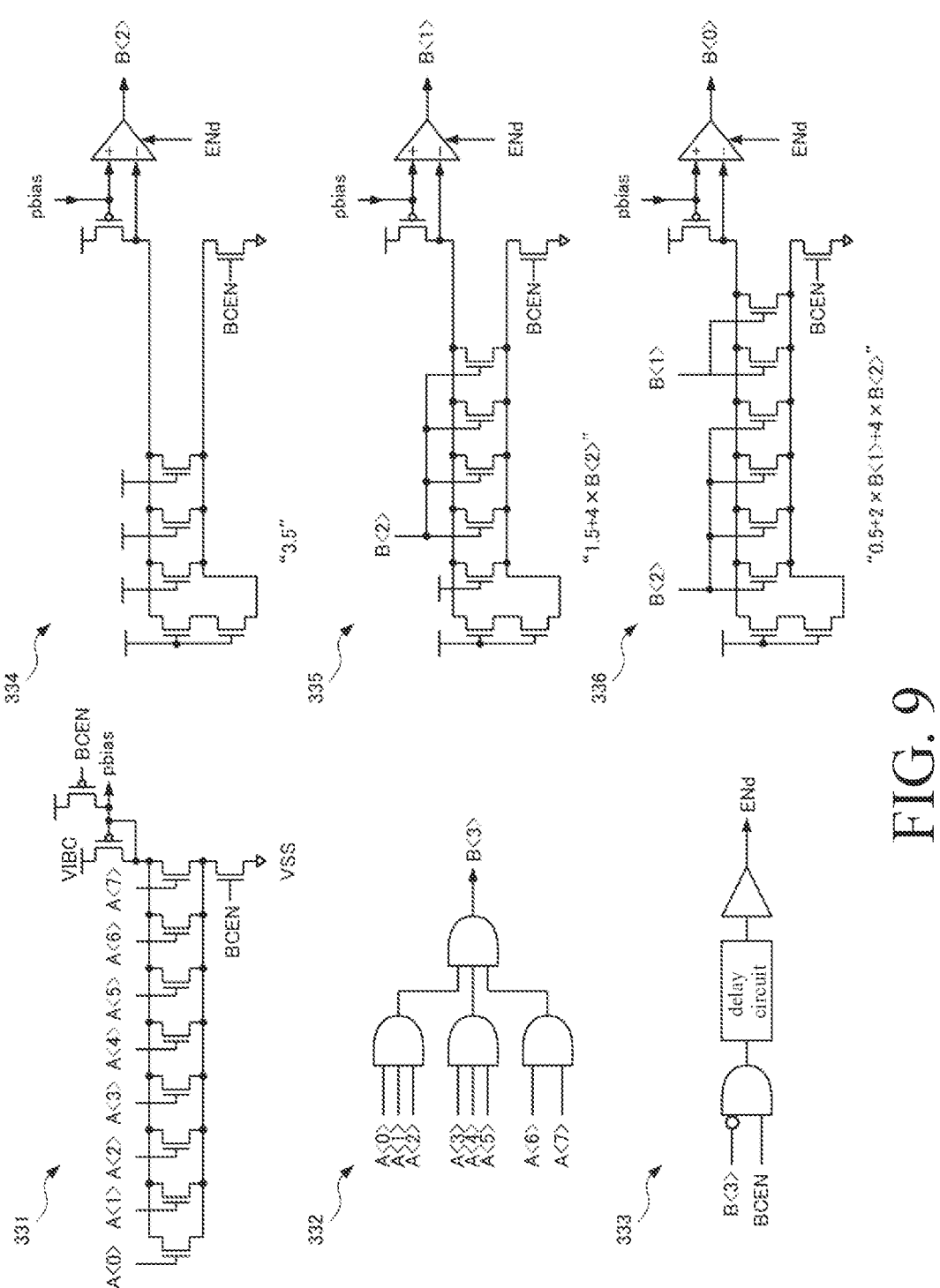
FIG. 9 is a circuit diagram of an example structure #2 of the sub-error bit counter shown in FIG. 6.

FIG. 9 is a circuit diagram of an example structure #2 of the sub-error bit counter 321 shown in FIG. 6. The sub-error bit counter 321 includes circuit blocks 331, 332, 333, 334, 335 and 336. When the control signal BCEN is HIGH, the circuit block 331 outputs the signal pbias. The signal pbias has a voltage corresponding to the total number of 1-bit data with a level of HIGH among the 1-bit data A<0> to A<7> as a reference voltage. That is, the circuit block 331 outputs the signal pbias, which has a voltage indicating the number of error bits corresponding to an 8-bit portion, as a reference voltage. In addition, the circuit block 331 is an example of the "second block" in the present invention.

The circuit block 332 outputs the logical product of the data A<0> to A<7> as data B<3>. Here, the data B<3> shows the highest bit (MSB) of the partial error bit number B<3:0>. Therefore, when the eight bits of the data A<0> to A<7> are all HIGH, i.e., the 8 bits are all error bits, the data B<3> becomes HIGH. In addition, the circuit block 332 is an example of the "first block" in the present invention.

When the control signal BCEN is HIGH, the circuit block 333 has a voltage level logically inverted from the data B<3>, and outputs the delayed control signal ENd. In addition, the circuit block 333 is an example of "a device for deactivating the third block and one or more fourth blocks" in the present invention.

When the data B<3> is HIGH, since the data B<2>, the data B<1> and the data B<0> are expected to be LOW, the operations of the amplifiers in the circuit blocks 334, 335 and 336 are paused by the control signal ENd to save power. At this time, the data B<2>, data B<1> and data B<0> output by the circuit blocks 334, 335 and 336 respectively become LOW.

The circuit block 334 outputs the data B<2>. The level of the data B<2> is determined by comparing the voltage of the signal pbias corresponding to the actual number of error bits (reference voltage) with the voltage of the signal corresponding to 3.5 error bits. Therefore, the data B<2> becomes HIGH when the partial error bit number is between 4 and 7. Here, the data B<2> is the second MSB of the data B<3:0>, which indicates the partial error bit number.

The circuit block 335 outputs the data B<1>. The level of the data B<1> is determined by comparing the voltage of the signal pbias corresponding to the actual number of error bits (reference voltage) with the voltage of the signal corresponding to 1.5+4×B<2> error bits. Therefore, the data B<1> becomes HIGH when the partial error bit number is 2, 3, 6 or 7. In addition, the circuit block 335 is an example of the "third block" in the present invention. Here, the data B<1> is the third MSB of the data B<3:0>, which indicates the partial error bit number.

The circuit block 336 outputs the data B<0>. The data B<0> is determined by comparing the voltage of the signal pbias corresponding to the actual number of error bits (reference voltage) with the voltage of the signal corresponding to 0.5+2×B<1>+4×B<2> error bits. Therefore, data B<0> becomes HIGH when the number of partial error bits is 1, 3, 5 or 7. In addition, the circuit block 336 is an example of the "fourth block" in the present invention.

Figure 10:
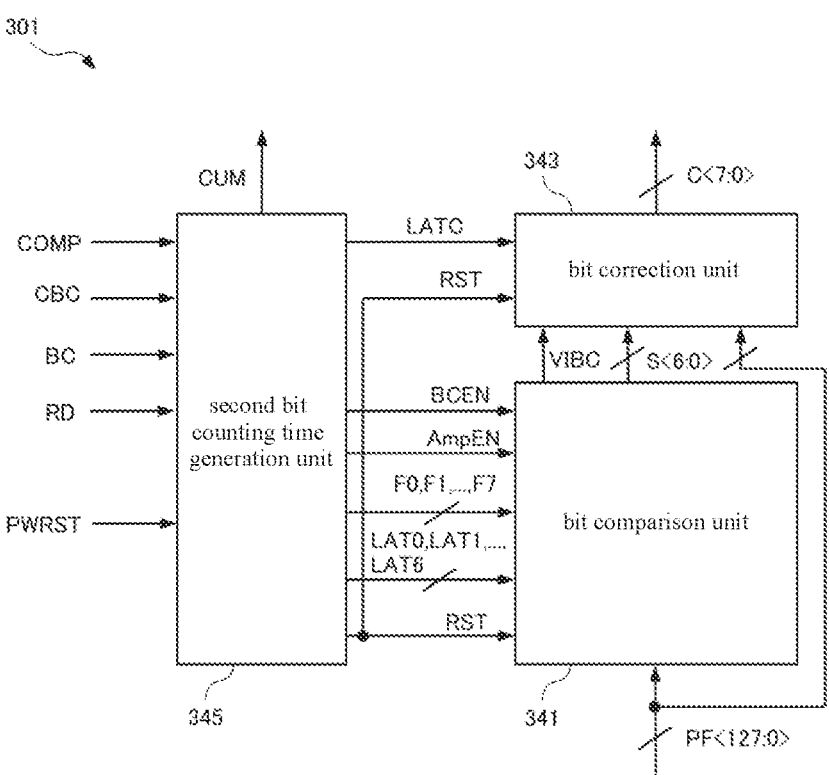
FIG. 10 is a block diagram of an example structure #2 of the bit counting unit shown in FIG. 3 and FIG. 17.

FIG. 10 is a block diagram of an example structure #2 of the bit counting unit 301 shown in FIG. 3. The bit counting unit 301 includes a bit comparison unit 341, a bit correction unit 343, and a second bit counting time generation unit 345. The bit comparison unit 341 inputs the error bit data PF<127:0>, and outputs the uncorrected error bit number S<6:0>. The uncorrected error bit number S<6:0> is the number that is the same as or differs only by 1 from the error bit number. The bit correction unit 343 corrects the uncorrected error bit number S<6:0> through a correction operation as needed, and outputs the determined error bit number C<7:0>. The second bit counting time generation unit 345 generates signals for the operations of the bit comparison unit 341 and the bit correction unit 343. In addition, the second bit counting time generation unit 345 is included in an example of the "calculation unit" in the present invention.

Figure 11:
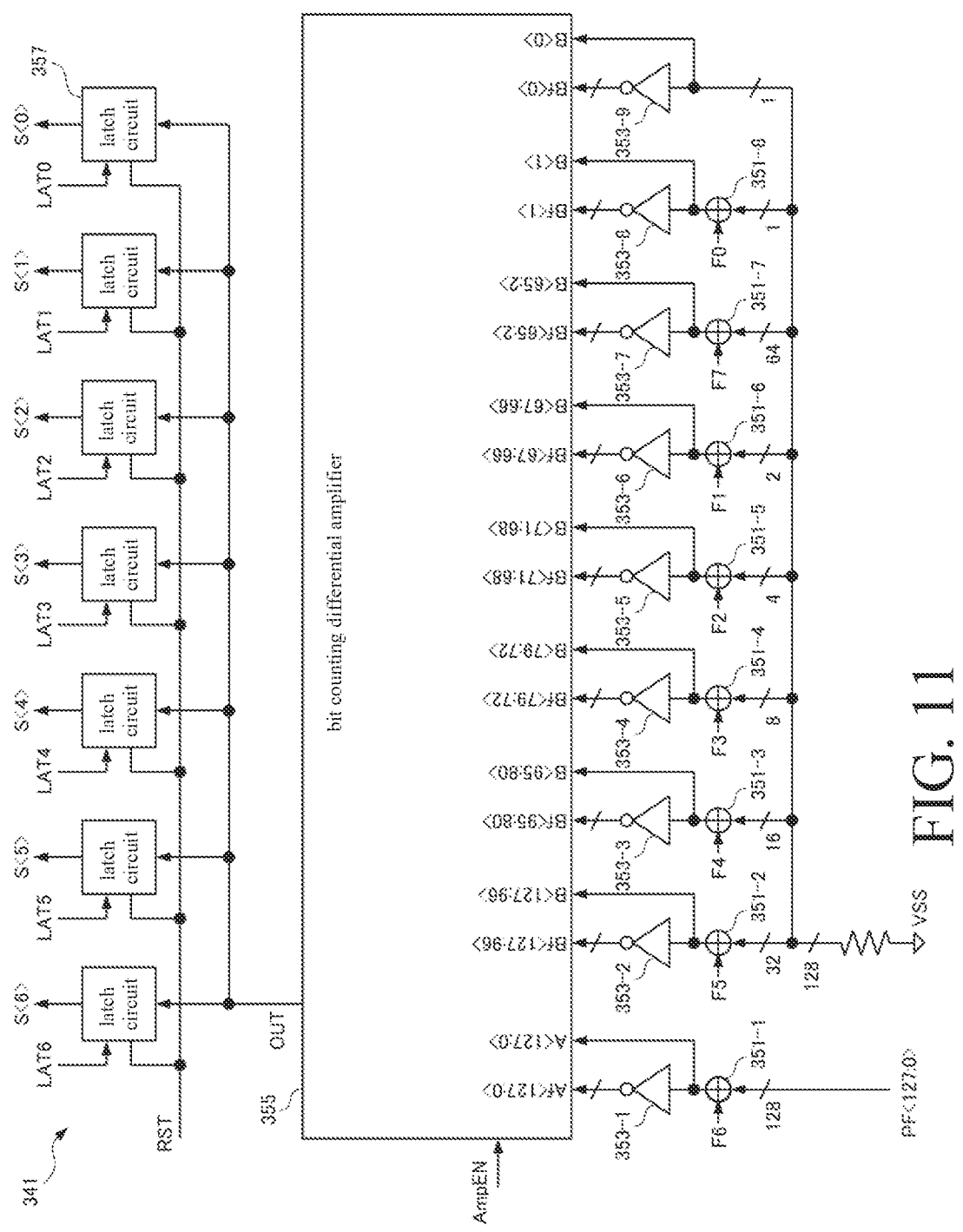
FIG. 11 is a circuit diagram of the structure of the bit comparison unit shown in FIG. 10.

FIG. 11 is a circuit diagram of the structure of the bit comparison unit 341 shown in FIG. 10. The bit comparison unit 341 includes eight XOR gate groups 351-1 to 351-8, nine NOT gate groups 353-1 to 353-9, a bit counting differential amplifier 355 and seven latch circuits 357.

Non-inverted error bit data with same data as the error bit data PF<127:0> or inverted error bit data obtained by inverting each bit of the error bit data PF<127:0> is provided to the bit counting differential amplifier 355 as measurement object data A<127:0>. Data to be compared with the measurement object data A<127:0> is provided to the bit counting differential amplifier 355 as reference data B<127:0>. The complementary data Af<127:0> of the measurement object data A<127:0> and the complementary data Bf<127: 0> of the reference data B<127:0> are also provided to the bit counting differential amplifier 355.

In the following description, the error bit number (or the non-inverted error bit number) is called FB. The inverted error bit is called FC when each bit of the error bit data is logically inverted. The number of bits with a logic level of HIGH in the measurement object data A<127:0> is called the measurement object bit number AA. The number of bits with a logic level of HIGH in the reference data B<127:0> is called the reference activation bit number BB. The bit comparison unit 341 controls the operation by the second bit counting time generation unit 345 applying the binary search algorithm. Through this control, the bit counting differential amplifier 355 in the bit comparison unit 341 outputs gradually-changing magnitude data (determination results) OUT based on the magnitude relationship between the measurement object bit number AA and the gradually-updated reference activation bit number BB. The bit comparison unit 341 uses the seven latch circuits 357 to output the uncorrected error bit number S<6:0>, which is composed of a plurality of bit data S<6>~S<0> obtained by sequentially sampling and synthesizing the magnitude data OUT.

In order to control the operation of the bit counting differential amplifier 355 through a binary-search-based algorithm, the second bit counting time generation unit 345 changes data F0 to F7 successively. The data F0 to F5 and F7 are provided to the bit counting differential amplifier 355 to adjust the reference activation bit number in the reference data B<127:0> and its complementary data Bf<127:0>. The data F6 is provided to the bit counting differential amplifier 355 to adjust the measurement object bit number shown in the measurement object data A<127:0> and its complementary data Af<127:0>.

The eight XOR gate groups 351-1 to 351-8 respectively include 128, 32, 16, 8, 4, 2, 64 and 1 two-input-one-output XOR gate. In addition, the eight NOT gate groups 353-1 to 353-8 respectively include 128, 32, 16, 8, 4, 2, 64 and 1 NOT gate. In addition, the exclusion OR gate group 351-1 and the NOT gate group 353-1 are examples of the "measurement object setting unit" in the present invention. The circuit configured to generate the data of B<127:0> and Bf<127:0> and including the XOR gate groups 351-2 to 351-8 and the NOT gate groups 353-2 to 353-9 is an example of the "reference data setting unit" in the present invention.

Generally, the error bit data PF<127:0> and the data F0 to F7 are provided to eight XOR gate groups 351-1 to 351-8. Each bit of the error bit data PF<127:0> is provided to the first input terminals of the 128 XOR gates included in the XOR gate group 351-1, and the data F6 is commonly provided to the second input terminals. Then, the output data of the 128 XOR gates included in the XOR gate group 351-1 is provided to the NOT gate group 353-1. The output data of the XOR gate group 351-1 and that of the NOT gate group 353-1 are provided to the bit counting differential amplifier 355 as the measurement object data A<127:0> and its complementary data Af<127:0>. Here, the circuit including the XOR gate group 351-1 and the NOT gate group 353-1 for generating the data of A<127:0> and Af<127:0> is an example of the "measurement data setting unit" in the present invention.

When the data F6 is LOW, the error bit data PF<127:0> directly becomes the measurement object data A<127:0>. On the other hand, when the data F6 is HIGH, data obtained by logically inverting the error bit data PF<127:0> in bit becomes the measurement object data A<127:0>. Here, the number of bits with a logic level of HIGH included in the measurement object data A<127:0>, which is obtained by logically inverting the error bit data PF<127:0> in bit, becomes 128 minus the number of error bits in the error bit data PF<127:0>.

As described later, before the error bit number is obtained through the binary search algorithm, whether the number of error bits in the error bit data PF<127:0> reaches 64 or not is determined. If the error bit number FB is less than 64, the error bit data PF<127:0> is directly set as the measurement object data A<127:0>. On the other hand, when the number of error bits FB is 64 or more, data obtained by logically inverting the error bit data PF<127:0> in bit is set as the measurement object data A<127:0>. Accordingly, the measurement object data A<127:0> is prevented from providing 64 or more to the bit counting differential amplifier 355. This can reduce errors caused by the voltage error that occurs when the measurement object data A<127:0> and the reference data B<127:0> are compared in the bit counting differential amplifier 355.

In addition, when each bit of the error bit data PF<127:0> is used directly as the measurement object data A<127:0> without being logically inverted, the error bit number FB directly becomes the measurement object bit number AA. On the other hand, when each bit of the error bit data PF<127:0> is logically inverted and used as the measurement object data A<127:0>, the inverted error bit number FC becomes the measurement object bit number AA.

The 128-bit output of the XOR gate group 351-1 is provided to the bit counting differential amplifier 355 as the measurement object data A<127:0>. The 128-bit output of the XOR gate group 351-1 is inverted through the NOT gate group 353-1 and provided to the bit counting differential amplifier 355 as the complementary data Af<127:0>.

With the 32 XOR gates included in the XOR gate group 351-2 and the 32 NOT gates included in the NOT gate group 353-2, the data F5 and its inverted data are provided to the bit counting differential amplifier 355 as the reference data B<127:96> and its complementary data Bf<127:96> respectively. Similarly below, with the XOR gate group 351-3 and the NOT gate group 353-3, the data F4 and its inverted data are provided to the bit counting differential amplifier 355 as the reference data B<95:80> and its complementary data Bf<95:80> respectively. With the XOR gate group 351-4 and the NOT gate group 353-4, the data F3 and its inverted data are provided to the bit counting differential amplifier 355 as the reference data B<79:72> and its complementary data Bf<79:72> respectively. With the XOR gate group 351-5 and the NOT gate group 353-5, the data F2 and its inverted data are provided to the bit counting differential amplifier 355 as the reference data B<71:68> and its complementary data Bf<71:68> respectively. With the XOR gate group 351-6 and the NOT gate group 353-6, the data F1 and its inverted data are provided to the bit counting differential amplifier 355 as the reference data B<67:66> and its complementary data Bf<67:66> respectively. With the XOR gate group 351-7 and the NOT gate group 353-7, the data F7 and its inverted data are provided to the bit counting differential amplifier 355 as the reference data B<65:2> and its complementary data Bf<65:2> respectively. With the XOR gate group 351-8 and the NOT gate group 353-8, the data F0 and its inverted data are provided to the bit counting differential amplifier 355 as the reference data B<1> and its complementary data Bf<1> respectively. In addition, data with a level of LOW and its inverted data with a level of HIGH obtained by the NOT gate 353-9 are respectively provided to the bit counting differential amplifier 355 as the reference data B<0> and its complementary data Bf<0>.

Figure 14:
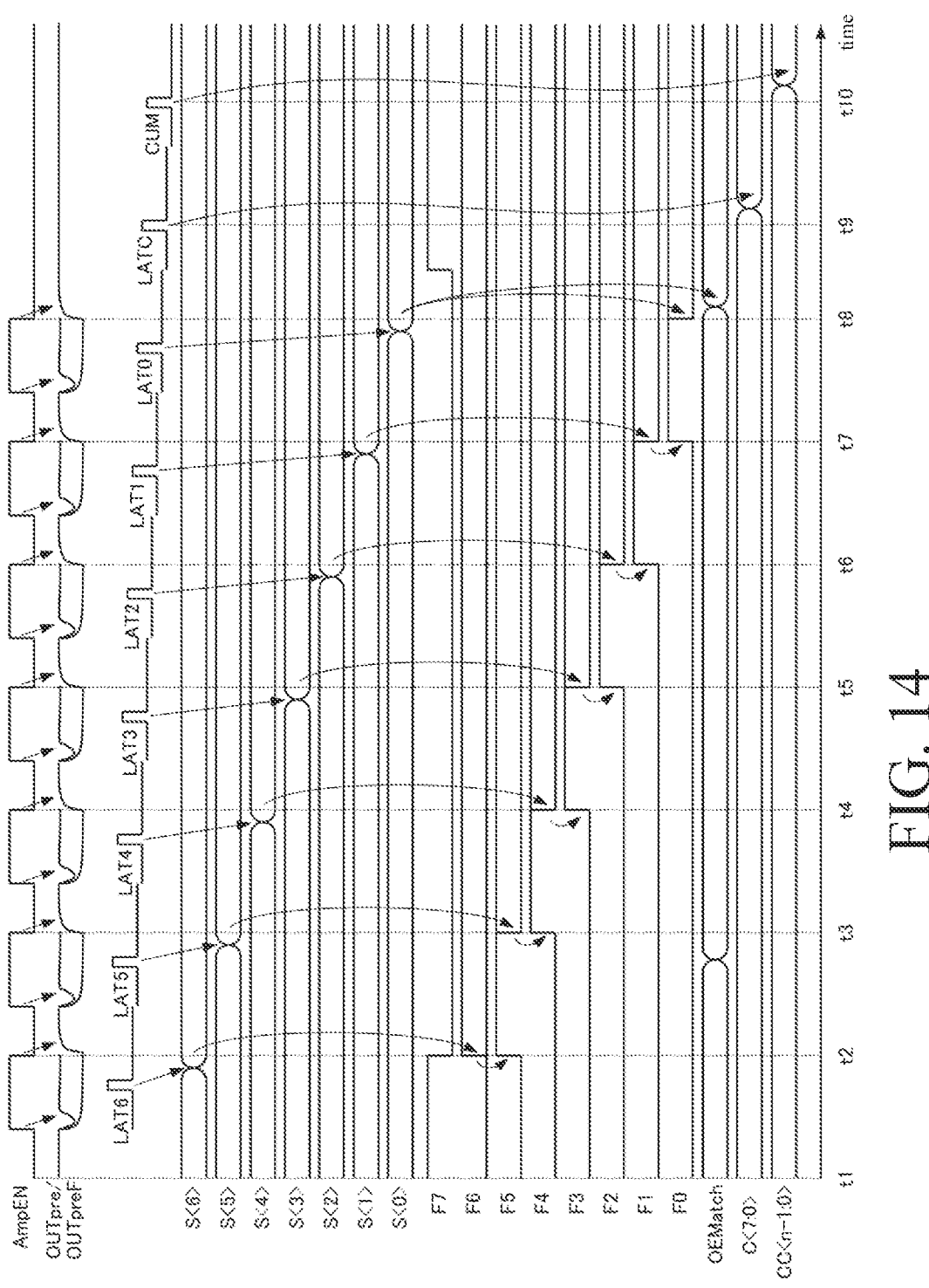
FIG. 14 is a time diagram for explaining the operation of the example structure #2 of the bit counting unit shown in FIG. 10.

The seven latch circuits 357 output and align the bit data S<6> to S<0> by latching the magnitude data OUT, which is sequentially output from the bit counting differential amplifier 355, according to the latch signals LAT6 to LAT0, which are continuously generated with time differences as shown in FIG. 14. The bit data S<6> to S<0> is composed of the uncorrected error bit number S<6:0>, which indicates the number of uncorrected error bits in binary.

As shown in FIG. 14, the bit data S<6> is latched almost before time t2. The bit data S<5> is latched almost before time t3. Similarly, the previous bit data S<8-$i$> is latched almost before time ti ($i$=4, 5, . . . , 8). Therefore, at time t8, the uncorrected error bit number S<6:0> is determined.

Figure 12:
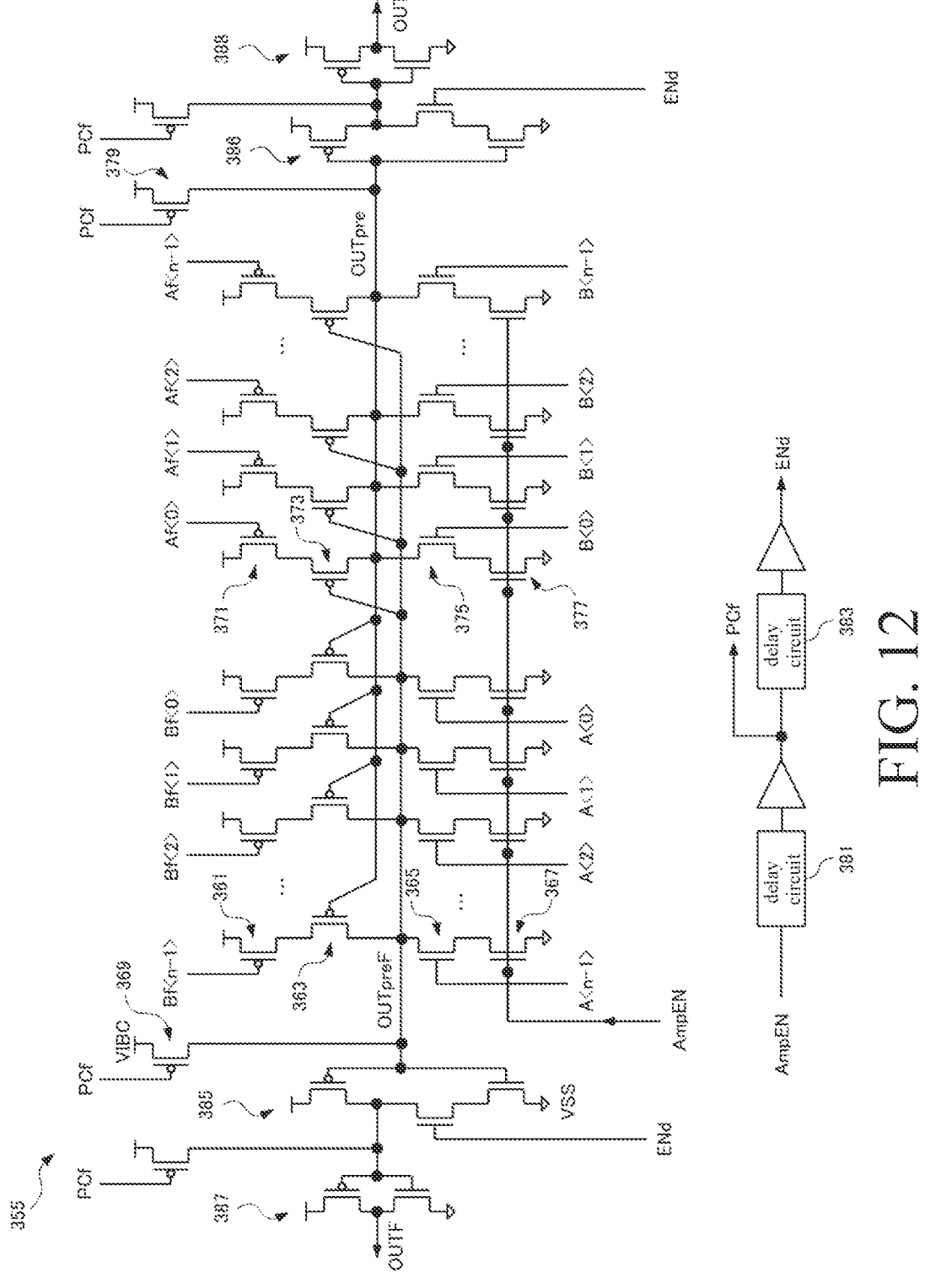
FIG. 12 is a circuit diagram of the structure of the bit counting differential amplifier shown in FIG. 11.

FIG. 12 is a circuit diagram of the structure of the bit counting differential amplifier 355 shown in FIG. 11. In the bit counting differential amplifier 355, P-channel MOS transistors 361 and 363, a N-channel MOS transistor 365, and a N-channel MOS transistor 367 include 128 groups of Group 1 directly connected from the power supply side to the ground side. The P-channel MOS transistor 361 and 363 are controlled by the complementary data Bf<i> of the reference data B<i> (i=0, 1, 2, . . . , n–1; n=128). The N-channel MOS transistor 365 is controlled by the measurement object data A<i>. The N-channel MOS transistor 367 is controlled by the signal Amp EN. In addition, a P-channel MOS transistor 371 and a P-channel MOS transistor 373, a N-channel MOS transistor 375, and a N-channel MOS transistor 377 include 128 groups of Group 2 directly connected from the power supply side to the ground side. The P-channel MOS transistor 371 and the P-channel MOS transistor 373 are controlled by the complementary data Af<i> of the measurement object data A. The N-channel MOS transistor 375 is controlled by the reference data B<i>. The N-channel MOS transistor 377 is controlled by the signal Amp EN. Next, the drains of the P-channel MOS transistors 363 and the N-channel MOS transistors 365 in each Group 1 are connected by a wire. The wire is further configured to control the P-channel MOS transistors 373 included in each Group 2. Likewise, the drains of the P-channel MOS transistors 373 and N-channel MOS transistors 375 included in each Group 2 are connected by a wire. The wire are further configured to control the P-channel MOS transistors 373 included in each Group 1. The signal of the wire that connects the drains of the P-channel MOS transistors 363 and N-channel MOS transistors 365 included in each Group 1 may also be set as an internal signal OUTpreF. The signal of the wire that connects the drains of the P-channel MOS transistors 373 and N-channel MOS transistors 375 included in each Group 2 may also be set as an internal signal OUTpre.

If the signal AMPEn changes from LOW to HIGH, the signal PCf also changes from LOW to HIGH after a specific delay time by the delay circuit 381, and then the signal ENd also changes from LOW to HIGH after a specific delay time by another delay circuit 383. In addition, when the signal PCf changes from LOW to HIGH, the gate 369 and the gate 379 are closed. Therefore, when the signal AMPEn changes from LOW to HIGH, all N-channel MOS transistors 367 and all N-channel MOS transistors 377 are turned on. Furthermore, the levels of the internal signals OUTpre and OUTpreF become complementary to each other according to the number of bits with a level of HIGH included in the measurement object data A<n–1:0> (i.e., the measurement object data bit number AA) and the number of bits with a level of HIGH included in the reference data B<n–1:0> (i.e., the reference activation bit number BB). After a specific delay time, the gates 385 and 386 opened by the signal ENd and their subsequent gates 387 and 388 complementarily output the magnitude data OUT corresponding to the internal signal OUTpre and the complementary data OUTF corresponding to the internal signal OUTpreF.

Specifically, during the period when the external signal AmpEN is HIGH, if the number of data with a level of HIGH among the data A<n–1> to A<0> (i.e., the measurement object data bit number AA) exceeds that among the data B<n–1> to B<0> (i.e., the reference activation bit number), the internal signal OUTpre and its inverted signal OUTpreF respectively become HIGH and LOW. On the other hand, during the period when the external signal Amp EN is HIGH, if the number of data with a level of HIGH among the data A<n–1> to A<0> (i.e., the measurement object data bit number AA) does not reach that among the data B<n–1> to B<0> (i.e., the reference activation bit number), the internal signal OUTpre and its inverted signal OUTpreF respectively become LOW and HIGH. Next, during the period when the external signal Amp EN is HIGH, the internal signal OUTpre and the inverted internal signal OUTpreF are output externally as the magnitude data OUT and its complementary data OUTF.

Figure 13:
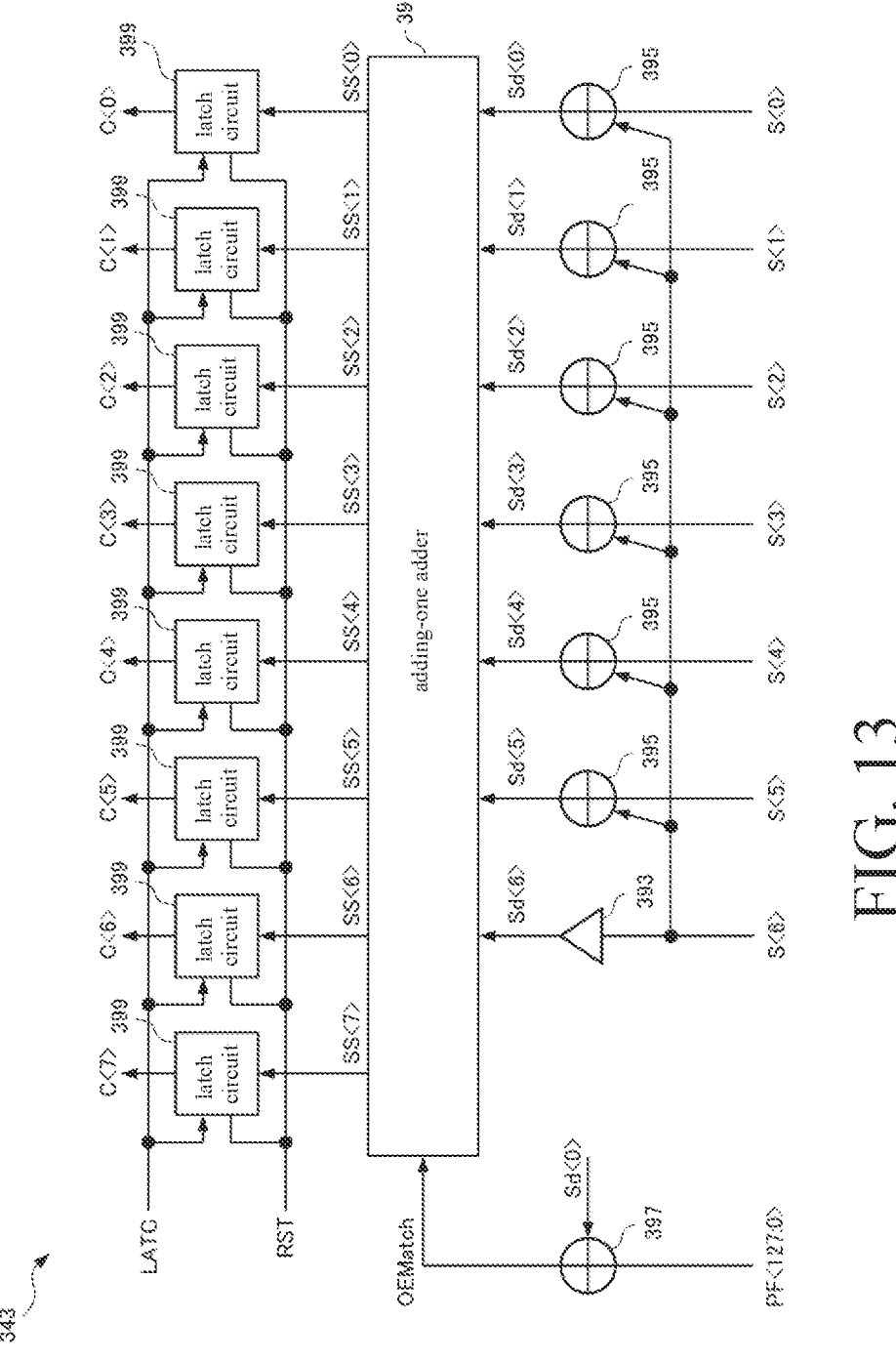
FIG. 13 is a circuit diagram of the structure of the bit correction unit shown in FIG. 10.

FIG. 13 is a circuit diagram of the structure of the bit correction unit 343 shown in FIG. 10. The bit correction unit 343 includes a buffer 393, six 2-input XOR gates 395, a 129-input XOR gate 397, an adding-one adder 391, and eight latch circuits 399. After intermediately corrected by the buffer 393 and the six 2-input XOR gates 395, the uncorrected error bit number S<6:0> is provided to the adding-one adder 391 as an intermediate error bit number Sd<6:0>. Next, the adding-one adder 391 controlled by 129-input XOR gate 397 applies the post-correction on the intermediate error bit number Sd<6:0>. Then, the intermediate error bit number Sd<6:0> begins passing through the 8 latches and is output from the bit correction unit 343 as the determined error bit number C<7:0>. In the intermediate correction, when the inverted error bit number FC is served as the measurement object bit number AA in the bit comparison unit 341, the corresponding operation is performed. In the post-correction, when an error occurs in the uncorrected error bit number S<6:0>, the operation correcting the error is executed. Next, the bit data S<6> included in the uncorrected error bit number S<6:0> is provided to the adding-one adder 391 via the buffer 393. After applied XOR operation on the bit data S<6> in the XOR gate 395, each of the bit data S<5> to S<0> included in the uncorrected error bit number S<6:0> is provided to the adding-one adder 391.

Therefore, if the bit data S<6> is LOW, the uncorrected error bit number S<6:0> is directly provided to the adding-one adder 391 as the intermediate error bit number Sd<6:0>. On the other hand, if the bit data S<6> is HIGH, data obtained by subtracting the value of the uncorrected error bit number S<6:0> from 127 will be provided to the adding-one adder 391 as the intermediate error bit number Sd<6:0>. When the number of error bits is 64 or more as mentioned above, the inverted error bit number FC obtained by subtracting the error bit number FB from 128 substitutes the error bit number FB as the measurement object bit number AA. Then, a binary search algorithm is applied to find the corresponding measurement object bit number AA. That is, the uncorrected error bit number S<6:0> corresponds to the binary number obtained by subtracting the error bit number from 128.

The 129-input XOR gate 397 calculates the exclusive logic between all bits of the error bit data PF<127:0> and the lowest bit (LSB) of the intermediate error bit number Sd<6:0>, i.e., Sd<0>. That is, the 129-input XOR gate 397 performs XOR on the 129 inputs. The result is provided to the adding-one adder 391 as control data OEMatch. The control data OEMatch is used as an enable signal for addition in the adding-one adder 391. Here, the control data OEMatch becomes LOW when the parity of the error bit data PF<127:0> is consistent with that of the data Sd<0>. The control data OEMatch becomes HIGH when the parity of the error bit data PF<127:0> is inconsistent with that of the data Sd<0>.

Therefore, when the parity of the actual error bit number in the bit-expanded error bit data PF<127:0> detected by the bit detection unit 201 is inconsistent with that of the uncorrected error bit number indicated by the 7-bit binary uncorrected error bit number S<6:0>, the adding-one adder 391 adds one to the intermediate error bit number. Next, the added data is output from the adding-one adder 391 as the corrected error bit number SS<7:0> indicating the corrected error bit number. On the other hand, when the parity of the actual error bit number in the error bit data PF<127:0> is consistent with the parity of the uncorrected error bit number indicated by the uncorrected error bit number S<6:0>, the intermediate error bit number Sd<6:0> input to the adding-one adder 391 is directly output from the adding-one adder 391 as the corrected error bit number SS<7:0>.

The latch circuit 399 latches the respective bit data SS<7> to SS<0>, which constitutes the corrected error bit number SS<7:0> output from the adding-one adder 391, to output as C<7> to C<0>. The binary determined error bit number C<7:0> obtained previously is the determined error bit number C<7:0> output from the bit counting unit 301.

In the bit comparison unit 341, when the inverted error bit number FC is used as the measurement object bit number AA, it is assumed that the data obtained from subtracting the uncorrected error bit number S<6:0> from 127 instead of 128 is served as the intermediate error bit number Sd<6:0>. That is, when no error occurs, the intermediate error bit number Sd<6:0> becomes the correct error bit number FB. On the other hand, when an error occurs, the intermediate error bit number Sd<6:0> minus 1 is served as the correct error bit number FB instead.

Therefore, the Following Configurations and Operations are Required:

Configuration: Replace an adding-one adder 391 with a ±1 adder.

Operation #1: Use the non-inverted error bit number FB in the bit comparison unit 341 as the measurement object bit number AA. When there is no error, directly set the error bit number Sd<6:0> to SS<6:0> in the ±1 adder.

Operation #2: The bit comparison unit 341 uses the non-inverted error bit number FB as the measurement object bit number AA. When an error occurs, set the value Sd<6:0> plus 1 to SS<6:0>. That is, the ±1 adder adds 1 to Sd<6:0>.

Operation #3: Invert the error bit number FC as the measurement object bit number AA. When there is no error, set the error bit number Sd<6:0> to SS<6:0>.

Operation #4: Invert the error bit number FC as the measurement object bit number AA. When an error occurs, set the value of Sd<6:0> minus 1 to SS<6:0>. That is, the ±1 adder subtracts 1 from Sd<6:0>.

In order to have such configurations and operations, a larger-scale circuit and more computation are required by comparison.

Figure 15:
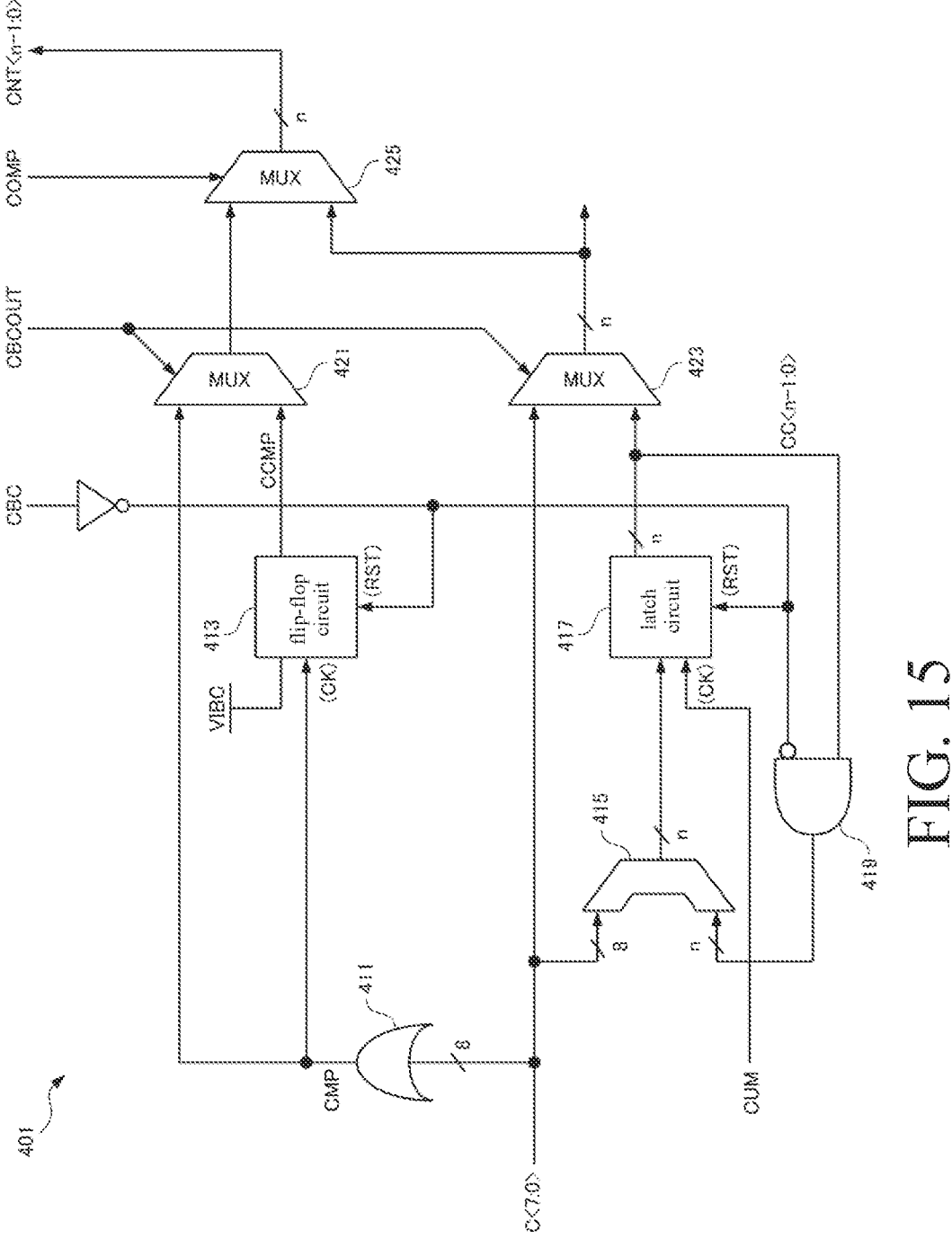
FIG. 15 is a circuit diagram illustrating the structure of the bit count accumulation unit shown in FIG. 3 and FIG. 17.

FIG. 15 is a circuit diagram illustrating the structure of the bit count accumulation unit 401 shown in FIG. 3. The 8-input XOR gate 411 outputs the logical sum of all bits of the determined error bit number C<7:0> that indicates the number of error bits as the data CMP. Therefore, if there is no error bit in a group of error bit data PF<127:0>, the data CMP is LOW. If there is at least one error in a group of error bit data PF<127:0>, the bit is HIGH. That is, the data CMP shows whether there are error bits for a group of error bit data PF<127:0>.

The output data CCMP of the flip-flop circuit 413 becomes LOW by the reset signal RST corresponding to the control signal CBC, and then the data CMP changes from LOW to HIGH. Therefore, the data CCMP shows whether all error bit data PF<127:0> that are the object of error bit detection have error bits. That is, the i-th error bit data PF<127:0> is marked as PF(i). If the error bit number FB corresponding to PF(i) is set to FB(i), and if at least one error bit is generated from the first cycle after the generation of the CCMP reset signal RST to the current S-th cycle, then the output data CCMP of the flip-flop circuit 413 becomes HIGH.

The accumulation circuit is composed of an 8/n-bit adder 415 and a latch circuit 417. Therefore, the data CC<n−1:0> output by the latch circuit 417 shows whether there are error bits for all the error bit data PF<127:0> that are the object of error bit detection. That is, the i-th error bit data PF<127: 0> is marked as PF(i). If the error bit number FB corresponding to PF(i) is set to FB(i), then the data CC<n−1:0> output by the latch circuit 417 shows the number of error bits accumulated from the first cycle after the generation of the reset signal RST to the current S-th cycle:

$$\sum_{i=1\sim S} FB(i)$$

The multiplexers MUX421, 423 and 425 select one of the data CMP, the data CCMP, the determined error bit number C<7:0> and the accumulated error bit number CC<n−1:0> according to the combination of the control signal CBOUT and the control signal COMP as data CNT<n−1:0>.

FIG. 14 is a time diagram for explaining the operation of the example structure #2 of the bit counting unit shown in FIG. 10.

In addition, in the following description, although it is marked that:

$$(F7,F6,F5,F4,F3,F2,F1,F0)=(X7,X6,X5,X4,X3,X2,X1,X0)$$

At this time, the measurement object bit number AA and the reference activation bit number BB are as follows:

$$AA=FB(\text{when } F6=\text{LOW})$$

$$128-FB(\text{when } F6=\text{HIGH})$$

$$BB=x7\cdot64+x5\cdot32+x4\cdot16+x3\cdot8+x2\cdot4+x1\cdot2+x0$$

Here,
When xi=HIGH, xi=1
When xi=LOW, xi=0
When xi=HIGH/LOW, xi=1 or 0

<Time t1>
The data F7 is set to HIGH. On the other hand, the data F0 to F6 are set to LOW. Accordingly, the measurement object bit number AA is set to the error bit number FB, and the reference activation bit number BB becomes 64. Next, from the signal Amp EN changing from LOW to HIGH, the bit number 64 of the measurement object bit number AA and the reference activation bit number BB are compared by the bit counting differential amplifier 355. The magnitude data OUT from the bit count differential amplifier 355 indicating the comparison result is latched as the bit data S<6> in the latch circuit 357 by the latch signal LAT6. Specifically, if the error bit number FB is 64 or more, the bit data S<6> is set to HIGH. If the number of error bits FB is less than 64, the bit data S<6> is set to LOW. At this time, only the bit data S<6> included in the uncorrected error bit number S<6:0> is determined.

<Time t2>
The signal Amp EN returns from HIGH to LOW. The data F7 returns from HIGH to LOW. In addition, the data F5 is set to HIGH. Furthermore, the data F0-F4 remain LOW. Therefore, the reference activation bit number BB becomes 32. Here, the reference activation bit number BB is called the reference activation bit number BB #5. In addition, the value of the bit data S<6> is set to the value of the data F6. Specifically, if the error bit number FB is 64 or more, the data F6 is set to HIGH. If the error bit number FB is less than 64, the data F6 is set to LOW.

Therefore, the number of bits with logic levels of HIGH included in the measurement object data A<127:0> (the measurement object bit number AA) is determined as follows:

If the error bit number FB is 64 or more, the measurement object bit number AA is the same as the inverted error bit number FC, which is 128 minus the error bit number FB. In addition, when the number of error bits FB is less than 64, the measurement object bit number AA is the same as the error bit number FB (i.e., the non-inverted error bit number).

At this time, $$(F7,F6,F5,F4,F3,F2,F1,F0)=(L,H/L,H,L,L,L,L,L)$$

Next, when the signal Amp EN changes from LOW to HIGH, the measurement object bit number AA and the reference activation bit number BB #5 are compared by the bit counting differential amplifier 355.

The magnitude data OUT from the bit count differential amplifier 355 that indicates that the comparison result is latched as bit data S<5> in the latch circuit 357 by the latch signal LAT5. If the measurement object bit number AA exceeds the reference activation bit number BB #5, the latched bit data S<5> is HIGH. On the other hand, if the measurement object bit number does not reach the reference activation bit number BB #5, the latched bit data S<5> is LOW. At this time, the bit data S<5> is determined.

<Time t3>

The signal Amp EN returns from HIGH to LOW. The data F6 keeps the logic level set at time t2. Therefore, the measurement object bit number AA is maintained. In addition, the data F7 remains LOW. Furthermore, the value of the bit data S<5> is set as the value of data F5. Furthermore, the data F4 is set to HIGH. Furthermore, the data F0-F3 remain LOW. Therefore, if the reference activation bit number BB here is called the reference activation bit number BB #4, the reference activation bit number BB #4 is S<5>x32+16.

At this time, $$(F7,F6,F5,F4,F3,F2,F1,F0)=(L,H/L,H/L,H,L,L,L,L)$$

Next, when the signal Amp EN changes from LOW to HIGH, the measurement object bit number AA and the reference activation bit number BB #4 are compared by the bit counting differential amplifier 355. The magnitude data OUT from the bit count differential amplifier 355 indicating the comparison result is latched as the bit data S<4> in the latch circuit 357 by the latch signal LAT4. Here, if the measurement object bit number AA exceeds the reference activation bit number BB #4, the latched bit data S<4> is HIGH. On the other hand, if the measurement object bit number AA does not reach the reference activation bit number BB #4, the latched bit data S<4> is LOW. At this time, the bit data S<4> is determined.

<Time t4>

The signal Amp EN returns from HIGH to LOW. The data F6 keeps the logic level set at time t2. Therefore, the measurement object bit number AA is maintained. In addition, the data F7 remains LOW. The data F5 keeps the logic level set at time t3. Furthermore, the value of bit data S<4> is set to the value of data F4. Furthermore, the data F3 is set to HIGH. Furthermore, the data F0-F2 remain LOW. Therefore, if the reference activation bit number BB here is called the reference activation bit number BB #3, the reference activation bit number BB #3 is S<4> x16+8.

At this time, $$(F7,F6,F5,F4,F3,F2,F1,F0)=(L,H/L,H/L,H/L,H,L,L,L)$$

Next, when the signal Amp EN changes from LOW to HIGH, the measurement object bit number AA and the reference activation bit number BB #3 are compared by the bit counting differential amplifier 355. The magnitude data OUT from the bit count differential amplifier 355 indicating the comparison result is latched as bit data S<3> in the latch circuit 357 by the latch signal LAT3. Here, if the measurement object bit number AA exceeds the reference activation bit number BB #3, the latched bit data S<3> is HIGH. On the other hand, if the measurement object bit number AA does not reach the reference activation bit number BB #3, the latched bit data S<3> is LOW. At this time, the bit data S<3> is determined.

<Time t5>

The signal Amp EN returns from HIGH to LOW. The data F6 keeps the logic level set at time t2. Therefore, the measurement object bit number AA is maintained. In addition, data F7 remains LOW. The data F5 and F4 keep the logic levels set at times t3 and t4 respectively. Furthermore, the value of the bit data S<3> is set to the value of the data F3. Furthermore, the data F2 is set to HIGH. Furthermore, the data F0~data F1 remain LOW. Therefore, if the reference activation bit number BB here is called the reference activation bit number BB #2, the reference activation bit number BB #2 is S<5> x32+S<4> x16+S<3> x8+4.

At this time, $$(F7,F6,F5,F4,F3,F2,F1,F0)=(L,H/L,H/L,H/L,H/L,H,L,L)$$

Next, when the signal Amp EN changes from LOW to HIGH, the measurement object bit number AA and the reference activation bit number BB #2 are compared by the bit counting differential amplifier 355. The magnitude data OUT from the bit count differential amplifier 355 indicating the comparison result is latched as bit data S<2> in the latch circuit 357 by the latch signal LAT2. Here, if t the measurement object bit number AA exceeds the reference activation bit number BB #2, the latched bit data S<2> is HIGH. On the other hand, if the measurement object bit number AA does not reach the reference activation bit number BB #2, the latched bit data S<2> is LOW. At this time, the bit data S<2> is determined.

<Time t6>

The signal Amp EN returns from HIGH to LOW. The data F6 keeps the logic level set at time t2. Therefore, the measurement object bit number AA is maintained. In addition, the data F7 remains LOW. The data F5, F4, and F3 keep the logic levels set at times t3, t4, and t5 respectively. Furthermore, the value of the bit data S<2> is set to the value of the data F2. Furthermore, the data F1 is set to HIGH. Furthermore, the data F0 remains LOW. Therefore, if the reference activation bit number BB here is called the reference activation bit number BB #1, the reference activation bit number BB #1 is S<5> x32+S<4> x16+S<3> x8+S<2> x4+2.

At this time, $$(F7,F6,F5,F4,F3,F2,F1,F0)=(L,H/L,H/L,H/L,H/L,H/L,H/L,H,L)$$

Next, when the signal Amp EN changes from LOW to HIGH, the measurement object bit number AA and the reference activation bit number BB #1 are compared by the bit counting differential amplifier 355. The magnitude data OUT from the bit count differential amplifier 355 indicating the comparison result is latched as bit data S<1> in the latch circuit 357 by the latch signal LAT1. Here, if the number of bits to be measured AA exceeds the reference activation bit number BB #1, the latched bit data S<1> is HIGH. On the other hand, if the measurement object bit number AA does not reach the reference activation bit number BB #1, the latched bit data S<1> is LOW. At this time, the bit data S<1> is determined.

<Time t7>

The signal Amp EN returns from HIGH to LOW. The data F6 keeps the logic level set at time t2. Therefore, the measurement object bit number AA is maintained. In addition, the data F7 remains LOW. The data F5, F4, F3, and F2 keep the logic levels set at times t3, t4, t5, and t6 respectively. Furthermore, the value of the bit data S<1> is set to the value of the data F1. Furthermore, the data F1 is set to the value of the bit data S<1>. Furthermore, the data F0 is set to HIGH. Therefore, if the reference activation bit number BB here is called the reference activation bit number BB #0, the reference activation bit number BB #0 is S<5>×32+S<4>×16+S<3>×8+S<2>×4+S<1>×2+1.

At this time, $$(F7,F6,F5,F4,F3,F2,F1,F0)=(L,H/L,H/L,H/L,H/L,H/L,H/L,L)$$

Next, when the signal Amp EN changes from LOW to HIGH, the measurement object bit number AA and the reference activation bit number BB #0 are compared by the bit counting differential amplifier 355. The magnitude data OUT from the bit count differential amplifier 355 indicating the comparison result is latched as bit data S<0> in the latch circuit 357 by the latch signal LAT0. Here, if the measurement object bit number AA exceeds the reference activation bit number BB #0, the latched bit data S<0> is HIGH. On the other hand, if the measurement object bit AA does not reach the reference activation bit number BB #0, the latched bit data S<0> is LOW. At this time, the bit data S<0> is determined. Therefore, since the bit data S<6>~S<0> have been determined, the uncorrected error bit number S<6:0> is determined at this time.

<Time t8>

Referring also to FIG. 13, in the example shown in FIG. 14, the bit data S<0> is determined shortly before time t8. In addition, the bit data S<6> is determined shortly before time t2. Therefore, in the output unit of the XOR gate 395 corresponding to the bit data S<0>, the intermediate error bit number Sd<6:0> obtained by the XOR between the bit data S<0> and the bit data S<6> is determined. Next, the error bit data PF<127:0> is determined at time earlier than time t1. Next, after time t8, the control data OEMatch is determined in the output unit of the 129-input XOR gate 397.

<Time t9>

In addition, the bit data S<5>~S<1> included in the uncorrected error bit number S<6:0> are determined shortly before time t3-t7 respectively. Therefore, at time t9, the latch circuit 399 latches the corrected error bit number SS<7:0> through the latch signal LATC. Wherein, the corrected error bit number SS<7:0> is determined by the output unit of the adding-one adder 391, which is controlled by the determined signal. The latch circuit 399 latches outputs the corrected error bit number SS<7:0> as the determined error bit number C<7:0>.

<Time t10>

When the accumulation circuit composed of the 8/n-bit adder 415 and the latch circuit 417 included in the bit count accumulation unit 401 shown in FIG. 15 is driven by the control signal CUM, the accumulated error bit number CC<n−1:0> is updated to itself plus the determined error bit number C<7:0>, which is the object of the current error bit measurement. If the operation shown in FIG. 14 is set to one cycle, the determined error bit number C<7:0> is obtained in each cycle. Next, every time the time advances by 1 cycle, the accumulated error bit number CC<n−1:0> is updated. In addition, the latch circuit 417 is set by the control signal CBC. Therefore, the accumulated error bit number CC<n−1:0> indicates the value of the determined error bit number C<7:0> accumulated from the generation of the control signal CBC to the present cycle.

When the bit counting differential amplifier 355 is configured to compare the measurement object data A<127:0> and the reference data B<127:0>, and when the measurement object bit number and the reference activation bit number is the same number, it is possible that errors occur in the logic level of the magnitude data OUT that indicates the comparison result even though the reference activation bit number is updated successively.

For example, when the error bit number is 24, it should be:

$$S<6> = LOW$$
$$S<5> = LOW$$
$$S<4> = HIGH$$
$$S<3> = HIGH$$
$$S<2> = LOW$$
$$S<1> = LOW$$
$$S<0> = LOW$$

Here, when obtaining the bit data S<3>, the error bit number, 24, of the measurement object bit number AA and the reference activation bit number BB are compared. The original value of the bit data S<3> should be HIGH, but it may become LOW due to the influence of semiconductor characteristics, e.g., manufacturing errors or noise. That is, during the tree search, the bit data S<3> should be determined to be HIGH, but the bit data S<3> is mistakenly determined to be LOW. At this time, the following can be obtained:

$$S<6> = LOW$$
$$S<5> = LOW$$
$$S<4> = HIGH$$
$$S<3> = LOW$$
$$S<2> = HIGH$$
$$S<1> = HIGH$$
$$S<0> = HIGH$$

In this case, the error bit number indicated by the uncorrected error bit number S<6:0> is not 24 but an error value of 23.

As described above, when the same number of measurement object bit number and the reference activation bit number are compared, it is possible to occur such errors.

Therefore, in general, it is possible that errors occur when the measurement object bit AA is compared with the reference activation bit number BB whose value is the same as the measurement object bit AA (i.e., AA=BB). It is impossible that errors occur when the measurement object bit AA is compared with the reference activation bit number BB whose value is not same as the measurement object bit AA (i.e., AA #BB). Here, when the measurement object bit AA and the reference activation bit number BB are equal, there are an error that the measurement object bit AA is mistakenly determined to be BB+1 and the measurement object bit AA, and an error that the measurement object bit AA is mistakenly determined to be BB−1. However, the bit counting unit 301 is designed not to keep away from the latter error.

Therefore, an error in the uncorrected error bit number is detected by the inconsistency in the parity of the error bit number and the parity of the uncorrected error bit number S<6:0>. If an error is detected in the uncorrected error bit number S<6:0>, it just needs to add one to the uncorrected error bit number S<6:0> in order to obtain the determined error bit number C<7:0>. However, the above is restricted to the case where the inverted error bit number is configured to be the measurement object bit number in the bit comparison unit 341. When the inverted error bit number in the bit comparison unit 341 is configured to be the measurement object bit number, the intermediate error bit number Sd<6:0> is obtained by merely logically inverting the bit data S<5:0> included in the uncorrected error bit number S<6:0> input from the bit comparison unit 341. Since this is a calculation to obtain 1'C of the uncorrected error bit number S<6:0>, the result is only 1 less than that of 2'C of uncorrected error bit number S<6:0>.

In this way, unlike the case where the non-inverted error bit number is configured to be the measurement object bit number in the bit comparison unit 341, the intermediate error bit number Sd<6:0> indicates the error bit number minus 1 when there is no error, and indicates the same number as the error bit number when there is an error. Therefore, when an error occurs in the bit comparison unit 341, the parity of the error bit number is consistent with the parity of the intermediate error bit number Sd<6:0>. When no error occurs in the bit comparison unit 341, the parity of the error bit number is inconsistent with the parity of the intermediate error bit number Sd<6:0>.

Therefore, even when the inverted error bit number is used as the measurement object bit number, the same operation as when the error bit number is used as the measurement object bit number can be performed. That is, if the parity of the error bit number is consistent with the parity of the uncorrected error bit number S<6:0>, only the intermediate error bit number Sd<6:0> is bit-expanded and set to the corrected error bit number SS<7:0>. In addition, if the parity of the error bit number is inconsistent with the parity of the uncorrected error bit number S<6:0>, the intermediate error bit number Sd<6:0> is added one and bit-expanded to be set to the corrected error bit number SS<7:0>.

The bit correction unit 343 inputs the uncorrected error bit number S<6:0> from the bit comparison unit 341.

If the bit data S<6> (i.e., MSB) of the uncorrected error bit number S<6:0>, is LOW, and the error bit number FB included in the error bit data PF<127:0> does not reach 64, the uncorrected error bit number S<6:0> represents the non-inverted error bit number FB in binary.

On the other hand, if the bit data S<6> is HIGH, the error bit number FB included in the error bit data PF<127:0> is more than 64, then the uncorrected error bit number S<6:0> represents the inverted error bit number FC in binary.

In addition, the uncorrected error bit number S<6:0> may has errors.

The bit correction unit 343 performs four types of operations based on the above combination.

An operation #1 related to the bit correction unit is under the condition where the error bit number FB included in the error bit data PF<127:0> does not reach 64 and there is no error in the uncorrected error bit number S<6:0>.

When the error bit number FB included in the error bit data PF<127:0> does not reach 64, the bit data S<6> is LOW as mentioned above. In addition, the uncorrected error bit number S<6:0> directly represents the error bit number FB as a 7-bit binary number. Therefore, the uncorrected error bit number S<6:0> is directly provided to the adding-one adder 391 as the intermediate error bit number Sd<6:0>.

The adding-one adder 391 bit-expands the intermediate error bit number Sd<6:0> and outputs it as the corrected error bit number SS<7:0>. Since the input terminal on one side of the six XOR gates 395 is provided with the bit data S<6> with a level of LOW, the six XOR gates 395 directly provide the bit data S<5:0> to the adding-one adder 391 as the bit data Sd<5:0>. In addition, the buffer 393 directly provides the bit data S<6> with a level of LOW as the bit data Sd<6> to the adding-one adder 391.

In addition, when the error bit number is an even number, the data Sd<0> is LOW. When the error bit number is an odd number, the data Sd<0> is HIGH. Therefore, in any case, the 129-input XOR gate 397 provides the control data OEMatch with the value LOW to the adding-one adder 391, so the adding-one adder 391 does not perform an addition. That is, only the intermediate error bit number Sd<6:0> is merely bit-expanded and output as the corrected error bit number SS<7:0>.

An operation #2 related to the bit correction unit is under the condition where the error bit number FB included in the error bit data PF<127:0> does not reach 64 and there is an error in the uncorrected error bit number S<6:0>.

When the error bit number FB in the error bit data PF<127:0> does not reach 64, the bit data S<6> is LOW. In addition, the uncorrected error bit number S<6:0> directly represents the error bit number FB as a 7-bit binary number. Therefore, the uncorrected error bit number S<6:0> is directly provided to the adding-one adder 391 as the intermediate error bit number Sd<6:0>.

The adding-one adder 391 adds 1 to the intermediate error bit number Sd<6:0>, bit-expands it and outputs it as the corrected error bit number SS<7:0>. Since the input terminal on one side of the XOR gate 395 is provided with the bit data S<6> with a level of LOW, the XOR gate 395 directly provides S<5:0> as Sd<5:0> to the adding-one adder 391, and the buffer 393 directly provides the bit data S<6> with a level of LOW to the adding-one adder 391 as Sd<6>.

When the error bit number is an even number, the data Sd<0> changes from LOW to HIGH due to errors. When the number of error bits is an odd number, the data Sd<0> changes from HIGH to LOW. Therefore, in any case, the 129-input XOR gate 397 provides the control data OEMatch with the value HIGH to the adding-one adder 391, and the adding-one adder 391 performs the addition. That is, the intermediate error bit number Sd<6:0> is increased by 1, then bit-expanded, and then output as the corrected error bit number SS<7:0>.

An operation #3 related to the bit correction unit is under the condition where the error bit number FB included in the error bit data PF<127:0> is 64 or more and there is no error in the uncorrected error bit number S<6:0>

If the error bit number FB included in the error bit data PF<127:0> is more than 64, the bit data S<6> is HIGH. In addition, the uncorrected error bit number S<6:0> represents the inverted error bit number FC as a 7-bit binary number. Therefore, the uncorrected error bit number S<6:0>, which indicates the number of inverted error bits, is converted into the intermediate error bit number Sd<6:0>, which indicates the number of non-inverted error bits minus 1. Then, it is provided to the adding-one adder 391.

The adding-one adder 391 adds 1 to the intermediate error bit number Sd<6:0>, bit-expands it and outputs it as the corrected error bit number SS<7:0>. Since one side of the XOR gate 395 is provided with the bit data S<6> with a level of HIGH, the XOR gate 395 logically inverts S<5:0> and provides it to the adding-one adder 391 as Sd<5:0>. The buffer 393 directly provides the bit data S<6> with a level of HIGH as Sd<6> to the adding-one adder 391. Here, the uncorrected error bit number indicating the inverted error bit number sets the inverted error bit number minus one as Sd<6:0>.

In any case, the control data OEMatch with the value HIGH is provided to the adding-one adder 391, and the adding-one adder 391 performs the addition. That is, after being added 1, the intermediate error bit number Sd<6:0> is bit-expanded and output as the corrected error bit number SS<7:0>.

An operation #4 related to the bit correction unit is under the condition where the error bit number FB included in the error bit data PF<127:0> is 64 or more, and there is an error in the uncorrected error bit number S<6:0>.

If the error bit number FB included in the error bit data PF<127:0> is more than 64, the bit data S<6> is HIGH. In addition, the uncorrected error bit number S<6:0> represents the inverted error bit number FC as a 7-bit binary number. Therefore, the uncorrected error bit number S<6:0> is converted into the intermediate error bit number Sd<6:0> indicating the number of non-inverted error bits minus 1, and then provided to the adding-one adder 391.

The adding-one adder 391 does not add 1 to the intermediate error bit number Sd<6:0>, not bit-expands it, and not output it as the corrected error bit number SS<7:0>. Since one side of the XOR gate 395 is provided with the bit data S<6> with a level of HIGH, the XOR gate 395 logically inverts S<5:0> and provides it to the adding-one adder 391 as Sd<5:0>. The buffer 393 directly provides the bit data S<6> with a level of HIGH to the adding-one adder 391 as Sd<6>. Here, based on the uncorrected error bit number S<6:0>, the non-inverted error bits minus 1 can be obtained and set as Sd<6:0>.

In any case, the control data OEMatch with the value LOW is provided to the adding-one adder 391, so the adding-one adder 391 does not perform addition. That is, the intermediate error bit number Sd<6:0> is not added by 1, not bit-expanded, and not output as the corrected error bit number SS<7:0>.

5.7 SPECIFIC OPERATION EXAMPLES

Operation Example 1: When the Error Bit Number is 88~Part 1~

At time t1, it is detected that the initial reference activation bit number of number 88 of the error bit data included in the error bit data PF<127:0> is more than 64. Therefore, all the bits of the inverted error bit data PF<127:0> are provided to the bit counting differential amplifier 355 as the measurement object data A<127:0>. The measurement object bit number AA included in the measurement object data A<127:0> is 128−88=40.

From time t2 to time t7, the binary search algorithm is applied to obtain the uncorrected error bit number S<6:0> of the measurement object bit number AA included in the measurement object data A<127:0> in binary.

At time t8, the intermediate error bit number Sd<6:0> is obtained. The intermediate error bit number Sd<6:0> 127 minus the error bit number 40 (indicated by uncorrected error bit number S<6:0>) is 87. 87 is the correct value of the error bit number 88 minus 1.

At time t8, since the parity of the actual error bit number 88 is inconsistent with the parity of the error bit number 87 indicated by the intermediate error bit number Sd<6:0>, the determined error bit number C<7:0> indicating the correct error bit number 88 in binary is obtained by adding 1 to the error bit number 87 indicated by the intermediate error bit number Sd<6:0>.

Next, the operation at each time point is described in order.

<Time t1>

$$(F7,F6,F5,F4,F3,F2,F1,F0)=(H,L,L,L,L,L,L,L)$$

The error bit number 88 in the measurement object data A<127:0>, which is the same as the error bit data PF<127:0>, is compared with the reference activation bit number 64 in the reference data B<127:0>. At this time, the bit data S<6> of the comparison result becomes HIGH.

<Time t2>

$$(F7,F6,F5,F4,F3,F2,F1,F0)=(L,H,H,L,L,L,L,L)$$

The error bit number 40 (=128−88) in the measurement object data A<127:0> is compared with the reference activation bit number 32 in the reference data B<127:0>. At this time, the bit data S<5> becomes HIGH.

<Time t3>

$$(F7,F6,F5,F4,F3,F2,F1,F0)=(L,H,H,H,L,L,L,L)$$

The error bit number 40 in the measurement object data A<127:0> is compared with the reference activation bit number 48 in the reference data B<127:0>. At this time, the bit data S<4> becomes LOW.

<Time t4>

$$(F7,F6,F5,F4,F3,F2,F1,F0)=(L,H,H,L,H,L,L,L)$$

The error bit number 40 in the measurement object data A<127:0> is compared with the reference activation bit number 40 in the reference data B<127:0>. At this time, the bit data S<3> becomes HIGH.

<Time t5>

$$(F7,F6,F5,F4,F3,F2,F1,F0)=(L,H,H,L,H,H,L,L)$$

The error bit number 40 in the measurement object data A<127:0> is compared with the reference activation bit number 44 in the reference data B<127:0>. At this time, the bit data S<2> becomes LOW.

<Time t6>

$$(F7,F6,F5,F4,F3,F2,F1,F0)=(L,H,H,L,H,L,H,L)$$

The error bit number 40 in the measurement object data A<127:0> is compared with the reference activation bit number 42 in the reference data B<127:0>. At this time, the bit data S<1> becomes LOW.

<Time t7>

$$(F7,F6,F5,F4,F3,F2,F1,F0)=(L,H,H,L,H,L,L,H)$$

The error bit number 40 in the measurement object data A<127:0> is compared with the reference activation bit number 41 in the reference data B<127:0>. At this time, the bit data S<0> becomes LOW.

At this time, the latch circuit 357 determines that each of the bit data S<6>, S<5>, S<4>, S<3>, S<2>, S<1> and S<0> in the comparison result keeps logic levels of HIGH, HIGH, LOW, HIGH, LOW, LOW and LOW. Here, the uncorrected error bit number S<6:0> is 40.

<Time t8>

Since the number of error bits in the error bit data PF<127:0>, 88, exceeds the initial reference activation bit number, 64, the bit data S<6> becomes HIGH at time t1. Therefore, the intermediate error bit number Sd<6:0> is obtained by inverting each bit of the uncorrected error bit number S<6:0>. Since the bit data S<6>~S<0> collectively indicates 40, the intermediate error bit number Sd<6:0> is 87. The intermediate error bit number Sd<6:0> is obtained by subtracting 40 from 127, which is 1 less than 128.

The actual error bit number 88 is an even number. Since the intermediate error bit number Sd<6:0>, 87, is an odd number, the control data OEMatch indicates that the parity of the two is inconsistent. Therefore, the adding-one adder 391 outputs the corrected error bit number SS<7:0> that indicates the corrected error bit number, 88. The corrected error bit number, 88, is obtained by adding 1 to the uncorrected error bit number, 87, indicated by the intermediate error bit number Sd<6:0>.

Then, the determined error bit number C<7:0> indicating the number of error bits, 88, is determined by applying the latch signal to latch the corrected error bit number SS<7:0> in the latch circuit 399.

Then, by the control signal CUM, the 8/n-bit adder 415 and the latch circuit 417 in the bit count accumulation unit 401 add the determined error bit number C<7:0> indicating the number of error bits, 88, of the current measurement object data to the accumulated error bit number CC<n−1:0>.

Operation Example 2: When the Error Bit Number is 88~Part 2~

At time t1, it is detected that the reference activation bit number is initially 64 or more. Therefore, all the bits of the inverted error bit data PF<127:0> are provided to the bit counting differential amplifier 355 as the measurement object data A<127:0>. Here, the measurement object bit number AA in the measurement object data A<127:0> is 128−88=40.

From time t2 to time t7, the number of error bits S<6:0> before correction is obtained by following the binary search algorithm. Here, the uncorrected bit number S<6:0> obtained through the operations from time t2 to time t7 is originally 40. However, due to the influence of semiconductor-characteristic manufacturing errors or noise, this number turns into 39.

At time t8, the intermediate error bit number Sd<6:0> is obtained. The intermediate error bit number Sd<6:0> indicates a number, 88, that is obtained by subtracting the error bit number of uncorrected bit number S<6:0> from 127. The number, 88, is a correct number of error bits.

In addition, at time t8, the parity of the actual error bit number, 88, is consistent with that of the error bit number, 87, of the intermediate error bit number Sd<6:0>. Therefore, the determined error bit number C<7:0> directly indicates the error bit number, 88, of the intermediate error bit number in binary.

Next, the operation at each time point is described in order.

<Time t1>

$$(F7,F6,F5,F4,F3,F2,F1,F0)=(H,L,L,L,L,L,L,L)$$

The error bit number, 88, of the measurement object data A<127:0>, which is the same as the error bit data PF<127:0>, is compared with the reference activation bit number, 64, of the reference data B<127:0>. At this time, the bit data S<6> turns HIGH.

<Time t2>

$$(F7,F6,F5,F4,F3,F2,F1,F0)=(L,H,H,L,L,L,L,L)$$

The error bit number, 40 (=128−88), of the measurement object data A<127:0> is compared with the reference activation bit number, 32, of the reference data B<127:0>. The bit data S<5> turns HIGH.

<Time t3>

$$(F7,F6,F5,F4,F3,F2,F1,F0)=(L,H,H,H,L,L,L,L)$$

The error bit number, 40, of the measurement object data A<127:0> is compared with the reference activation bit number, 48, of the reference data B<127:0>. The bit data S<4> turns LOW.

<Time t4>

$$(F7,F6,F5,F4,F3,F2,F1,F0)=(L,H,H,L,H,L,L,L)$$

The error bit number, 40, of the measurement object data A<127:0> is compared with the reference activation bit number, 40, of the reference data B<127:0>. The bit data S<3> turns LOW.

<Time t5>

$$(F7,F6,F5,F4,F3,F2,F1,F0)=(L,H,H,L,L,H,L,L)$$

The error bit number, 40, of the measurement object data A<127:0> is compared with the reference activation bit number, 36, of the reference data B<127:0>. The bit data S<2> turns HIGH.

<Time t6>

$$(F7,F6,F5,F4,F3,F2,F1,F0)=(L,H,H,L,L,H,H,L)$$

The error bit number, 40, of the measurement object data A<127:0> is compared with the reference activation bit number, 38, of the reference data B<127:0>. The bit data S<1> turns HIGH.

<Time t7>

$$(F7,F6,F5,F4,F3,F2,F1,F0)=(L,H,H,L,L,H,H,H)$$

The error bit number, 40, of the measurement object data A<127:0> is compared with the reference activation bit number, 39, of the reference data B<127:0>. The bit data S<0> turns HIGH.

At this time, each of the bit data S<6>, S<5>, S<4>, S<3>, S<2>, S<1> and S<0> is determined to keep logic levels of HIGH, HIGH, LOW, LOW, HIGH, HIGH and HIGH. Here, the uncorrected error bit number is 39.

<Time t8>

Since the error bit number, 88, of the error bit data PF<127:0> exceeds the initial reference activation bit number, 64, the bit data S<6> turns HIGH at time t1. Therefore, the intermediate error bit number Sd<6:0> is obtained by inverting each bit of the uncorrected error bit number S<6:0>. Since the bit data S<6>~S<0> collectively indicates 39, the intermediate error bit number Sd<6:0> is 88 obtained by subtracting 39 from 127, which is 1 less than 128.

The actual error bit number, 88, is an even number. Since the intermediate number of error bits, 88, of the intermediate error bit number Sd<6:0> is an even number, the control data OEMatch indicates that the parity of the two is consistent.

Therefore, the adding-one adder 391 directly outputs the uncorrected number of error bits, 88, indicated by the intermediate error bit number Sd<6:0> as the corrected error bit number SS<7:0> indicating the corrected number of error bits, 88. Afterward, the determined error bit number C<7:0> indicating the number of error bits, 88, is determined by applying the latch signal LATC to latch the corrected error bit number SS<7:0> in the latch circuit 399 (refer to FIG. 13).

Then, by the control signal CUM, the 8/n-bit adder 415 and the latch circuit 417 in the bit count accumulation unit 401 add the determined error bit number C<7:0> indicating the number of error bits, 88, of the current measurement object data to the accumulated error bit number CC<n–1:0>.

Operation Example 3: When the Number of Error Bits is 24~Part 1~

At time t1, the number of error bits, 24, of the error bit data PF<127:0> detects that the initial reference activation bit number does not reach 64. Therefore, unlike the operation examples 1 and 2, the error bit data PF<127:0> is directly provided to the bit counting differential amplifier 355 as the measurement object data A<127:0> from time t2 to time t7.

From time t2 to time t7, the uncorrected error bit number is obtained by following the binary search algorithm.

At time t8, the intermediate error bit number Sd<6:0> that directly indicates the number of error bits, 24, of the uncorrected error bit number S<6:0> is obtained.

In addition, at time t8, the parity of the actual error bit number, 24, is consistent with that of the error bit number, 24, of the intermediate error bit number Sd<6:0>. Therefore, the determined error bit number C<7:0> directly indicates the error bit number, 24, of the intermediate error bit number in binary.

Next, the operation at each time point is described in order.
<Time t1>

$$(F7,F6,F5,F4,F3,F2,F1,F0)=(H,L,L,L,L,L,L,L)$$

The error bit number, 24, of the measurement object data A<127:0> is compared with the reference activation bit number, 64, of the reference data B<127:0>. The bit data S<6> turns LOW.
<Time t2>

$$(F7,F6,F5,F4,F3,F2,F1,F0)=(L,L,H,L,L,L,L,L)$$

The error bit number, 24, of the measurement object data A<127:0> is compared with the reference activation bit number, 32, of the reference data B<127:0>. The bit data S<5> turns LOW.
<Time t3>

$$(F7,F6,F5,F4,F3,F2,F1,F0)=(L,L,L,H,L,L,L,L)$$

The error bit number, 24, of the measurement object data A<127:0> is compared with the reference activation bit number, 16, of the reference data B<127:0>. The bit data S<4> turns HIGH.
<Time t4>

$$(F7,F6,F5,F4,F3,F2,F1,F0)=(L,L,L,H,H,L,L,L)$$

The error bit number, 24, of the measurement object data A<127:0> is compared with the reference activation bit number, 24, of the reference data B<127:0>. The bit data S<3> turns HIGH.

<Time t5>

$$(F7,F6,F5,F4,F3,F2,F1,F0)=(L,L,L,H,H,H,L,L)$$

The error bit number, 24, of the measurement object data A<127:0> is compared with the reference activation bit number, 28, of the reference data B<127:0>. The bit data S<2> turns LOW.
<Time t6>

$$(F7,F6,F5,F4,F3,F2,F1,F0)=(L,H,H,L,H,L,H,L)$$

The error bit number, 24, of the measurement object data A<127:0> is compared with the reference activation bit number, 26, of the reference data B<127:0>. The bit data S<1> turns LOW.
<Time t7>

$$(F7,F6,F5,F4,F3,F2,F1,F0)=(L,L,L,H,H,L,L,H)$$

The error bit number, 24, of the measurement object data A<127:0> is compared with the reference activation bit number, 25, of the reference data B<127:0>. The bit data S<0> turns LOW.

At this time, the latch circuit 357 determines that each of the bit data S<6>, S<5>, S<4>, S<3>, S<2>, S<1> and S<0> in the comparison result keeps logic levels of LOW, LOW, HIGH, HIGH, LOW, LOW and LOW. Here, the uncorrected error bit number S<6:0> is 40.
<Time t8>

Since the error bit number, 24, of the error bit data PF<127:0> does not reach the initial reference activation bit number, 64, the bit data S<6> turns LOW at time t1. Therefore, the uncorrected error bit number S<6:0> is directly set as the intermediate error bit number Sd<6:0>. Since the bit data S<6>~S<0> collectively indicates 24, the intermediate error bit number Sd<6:0> indicates 24.

The actual error bit number, 24, is an even number. Since the intermediate number of error bits, 24, indicated by the intermediate error bit number Sd<6:0> is an even number, the control data OEMatch indicates that the parity of the two is consistent. Therefore, the adding-one adder 391 directly outputs the number of uncorrected error bit, 24, indicated by the intermediate error bit number Sd<6:0> as the corrected error bit number SS<7:0>.

Afterward, the determined error bit number C<7:0> indicating the number of error bits, 24, is determined by applying the latch signal LATC to latch the corrected error bit number SS<7:0> in the latch circuit 399

Then, by the control signal CUM, the 8/n-bit adder 415 and the latch circuit 417 in the bit count accumulation unit 401 add the determined error bit number C<7:0> indicating the number of error bits, 24, of the current measurement object data to the accumulated error bit number CC<n–1:0>.

Operation Example 3: When the Number of Error Bits is 24~Part 2~

At time t1, the error bit data number, 24, of the error bit data PF<127:0> detects that the initial reference activation bit number does not reach 64. Therefore, unlike operation examples 1 and 2, the error bit data PF<127:0> is directly provided to the bit counting differential amplifier 355 as the measurement object data A<127:0> from time t2 to time t7.

From time t2 to time t7, the uncorrected error bit number S<6:0> is obtained by following the binary search algorithm. Here, the uncorrected error bit number S<6:0> obtained through the operations from time t2 to time t7 is originally 24. However, due to the influence of semiconductor-characteristic manufacturing errors or noise, this number turns 23.

At time t8, the intermediate error bit number Sd<6:0> that directly indicates the error bit number, 23, of the uncorrected error bit number S<6:0> is obtained.

In addition, at time t8, the parity of the actual error bit number, 24, is inconsistent with that of the error bit number, 23, of the intermediate error bit number Sd<6:0>. Therefore, the determined error bit number C<7:0> that indicates that the error bit number, 24, in binary is obtained by adding 1 to the number of error bits, 23, of the intermediate error bit number.

Next, the operation at each time point is described in order.

<Time t1>

$$(F7,F6,F5,F4,F3,F2,F1,F0)=(H,L,L,L,L,L,L,L)$$

The error bit number, 24, in the measurement object data A<127:0> is compared with the reference activation bit number, 64, in the reference data B<127:0>. The bit data S<6> turns LOW.

<Time t2>

$$(F7,F6,F5,F4,F3,F2,F1,F0)=(L,L,H,L,L,L,L,L)$$

The error bit number, 24, in the measurement object data A<127:0> is compared with the reference activation bit number, 32, in the reference data B<127:0>. The bit data S<5> turns LOW.

<Time t3>

$$(F7,F6,F5,F4,F3,F2,F1,F0)=(L,L,L,H,L,L,L,L)$$

The error bit number, 24, in the measurement object data A<127:0> is compared with the reference activation bit number, 16, in the reference data B<127:0>. The bit data S<4> turns HIGH.

<Time t4>

$$(F7,F6,F5,F4,F3,F2,F1,F0)=(L,L,L,H,H,L,L,L)$$

The error bit number, 24, in the measurement object data A<127:0> is compared with the reference activation bit number, 24, in the reference data B<127:0>. The bit data S<3> turns LOW due to the influence of semiconductor-characteristic manufacturing errors or noise.

<Time t5>

$$(F7,F6,F5,F4,F3,F2,F1,F0)=(L,L,L,H,L,H,L,L)$$

The error bit number, 24, in the measurement object data A<127:0> is compared with the reference activation bit number, 20, in the reference data B<127:0>. The bit data S<2> turns HIGH.

<Time t6>

$$(F7,F6,F5,F4,F3,F2,F1,F0)=(L,L,L,H,L,H,H,L)$$

The error bit number, 24, in the measurement object data A<127:0> is compared with the reference activation bit number, 22, in the reference data B<127:0>. The bit data S<1> turns HIGH.

<Time t7>

$$(F7,F6,F5,F4,F3,F2,F1,F0)=(L,L,L,H,L,H,H,H)$$

The error bit number, 24, in the measurement object data A<127:0> is compared with the reference activation bit number, 23, in the reference data B<127:0>. The bit data S<0> turns HIGH.

At this time, the latch circuit 357 determines that each of the bit data S<6>, S<5>, S<4>, S<3>, S<2>, S<1> and S<0> in the comparison result keeps logic levels of LOW, LOW, HIGH, LOW, HIGH, HIGH, and HIGH. Here, the uncorrected error bit number S<6:0> is 23.

<Time t8>

Since the error bit number, 24, of the error bit data PF<127:0> does not reach the initial reference activation bit number, 64, the bit data S<6> turns LOW at time t1. Therefore, the uncorrected error bit number S<6:0> is directly set as the intermediate error bit number Sd<6:0>. Since the bit data S<6>~S<0> collectively indicates 23, the intermediate error bit number Sd<6:0> is 23.

The actual error bit number 24 is an even number. Since the intermediate error bit number, 23, indicated by the intermediate error bit number Sd<6:0> is an odd number, the control data OEMatch indicates that the parity of the two is inconsistent. Therefore, the adding-one adder 391 adds 1 to the uncorrected error bit number, 23, of the intermediate error bit number Sd<6:0> to obtain and output the corrected error bit number SS<7:0> that indicates the corrected error bit number, 24.

Then, the determined error bit number C<7:0> indicating the number of error bits, 24, is determined by applying the latch signal LATC to latch the corrected error bit number SS<7:0> in the latch circuit 399 (refer to FIG. 13).

Then, by the control signal CUM, the 8/n-bit adder 415 and the latch circuit 417 in the bit count accumulation unit 401 add the determined error bit number C<7:0> indicating the number of error bits, 24, of the current measurement object data to the accumulated error bit number CC<n−1:0>.

Operation Example 5: When the Number of Error Bits is 128

At time t1, the error bit data number, 128, of the error bit data PF<127:0> detects that the initial reference activation bit number does not reach 64. Therefore, all bits of the inverted error bit data PF<127:0> are provided to the bit counting differential amplifier 355 as the measurement object data A<127:0>. Here, the measurement object bit number AA of the measurement object data A<127:0> is 128−128=0.

From time t2 to time t7, the uncorrected error bit number S<6:0> is obtained by following the binary search algorithm.

At time t8, the intermediate error bit number Sd<6:0> that indicates a number, 127, is obtained by subtracting the error bit number, 0, of the uncorrected error bit number S<6:0> from 127.

In addition, at time t8, the parity of the actual error bit number, 128, is inconsistent with that of the error bit number, 127, of the intermediate error bit number Sd<6:0>. Therefore, the determined error bit number C<7:0> that indicates the error bit number, 128, in binary is obtained by adding 1 to the number of error bits, 127, of the intermediate error bit number.

Next, the operation at each time point is described in order.

<Time t1>

$$(F7,F6,F5,F4,F3,F2,F1,F0)=(H,L,L,L,L,L,L,L)$$

The error bit number, 128, in the measurement object data A<127:0> is compared with the reference activation bit number, 64, in the reference data B<127:0>. The bit data S<6> turns HIGH.

<Time t2>

$$(F7,F6,F5,F4,F3,F2,F1,F0)=(L,H,H,L,L,L,L,L)$$

The error bit number, 0, in the measurement object data A<127:0> is compared with the reference activation bit number, 32, in the reference data B<127:0>. The bit data S<5> turns LOW.

<Time t3>

$$(F7,F6,F5,F4,F3,F2,F1,F0)=(L,H,L,H,L,L,L,L)$$

The error bit number, 0, in the measurement object data A<127:0> is compared with the reference activation bit number, 16, in the reference data B<127:0>. The bit data S<4> turns LOW.

<Time t4>

$$(F7,F6,F5,F4,F3,F2,F1,F0)=(L,H,H,L,H,L,L,L)$$

The error bit number, 0, in the measurement object data A<127:0> is compared with the reference activation bit number, 8, in the reference data B<127:0>. The bit data S<3> turns LOW.

<Time t5>

$$(F7,F6,F5,F4,F3,F2,F1,F0)=(L,H,H,L,L,H,L,L)$$

The error bit number, 0, in the measurement object data A<127:0> is compared with the reference activation bit number, 4, in the reference data B<127:0>. The bit data S<2> turns LOW.

<Time t6>

$$(F7,F6,F5,F4,F3,F2,F1,F0)=(L,H,L,L,L,L,H,L)$$

The error bit number, 0, in the measurement object data A<127:0> is compared with the reference activation bit number, 2, in the reference data B<127:0>. The bit data S<1> turns LOW.

<Time t7>

$$(F7,F6,F5,F4,F3,F2,F1,F0)=(L,H,H,L,L,H,H,H)$$

The error bit number, 0, in the measurement object data A<127:0> is compared with the reference activation bit number, 1, in the reference data B<127:0>. The bit data S<0> turns LOW.

At this time, the latch circuit 357 determines that each of the bit data S<6>, S<5>, S<4>, S<3>, S<2>, S<1> and S<0> in the comparison result keeps logic levels of HIGH, LOW, LOW, LOW, LOW, LOW and LOW. Here, the uncorrected error bit number S<6:0> is 0.

<Time t8>

Since the error bit number, 128, of the error bit data PF<127:0> exceeds the initial reference activation bit number, 64, the bit data S<6> turns HIGH at time t1. Therefore, each bit of the uncorrected error bit number S<6:0> is inverted to obtain the intermediate error bit number Sd<6:0>. Since the bit data S<6>~S<0> collectively indicates 0, the intermediate error bit number Sd<6:0> is 127. The intermediate error bit number Sd<6:0>, 127, is obtained by subtracting 0 from 127, which is 1 less than 128.

The actual error bit number, 128, is an even number. Since the intermediate error bit number, 127, indicated by the intermediate error bit number Sd<6:0> is an odd number, the control data OEMatch indicates that the parity of the two is inconsistent. Therefore, the adding-one adder 391 adds 1 to the uncorrected error bit number, 127, of the intermediate error bit number Sd<6:0> to obtain and output the corrected error bit number SS<7:0> that indicates the corrected error bit number, 128.

Then, the determined error bit number C<7:0> indicating the number of error bits, 128, is determined by applying the latch signal LATC to latch the corrected error bit number SS<7:0> in the latch circuit 399 (refer to FIG. 13).

Then, by the control signal CUM, the 8/n-bit adder 415 and the latch circuit 417 in the bit count accumulation unit 401 add the determined error bit number C<7:0> indicating the number of error bits, 128, of the current measurement object data to the accumulated error bit number CC<n−1:0>.

In a bit compression mode, the bit-counting process of the bit counting differential amplifier is used. In case 1, data indicating the occurrence of error bits is obtained instead of the number of error bits. In addition, in case 2, data that indicates the occurrence of error bits and whether the number of error bits is odd or even is obtained instead of the number of error bits.

<Time t1>

The data F7 to data F0 are all set to LOW. That is:

$$(F7,F6,F5,F4,F3,F2,F1,F0)=(L,L,L,L,L,L,L,L)$$

Therefore, the error bit data PF<127:0> is set as the measurement object data A<127:0> of the bit counting differential amplifier 355. In addition, the reference data B<127:0> of the bit counting differential amplifier 355 is set to 0.

Therefore, the bit counting differential amplifier 355 compares the number of error bits in the error bit data PF<127:0> with 0.

If the number of error bits in the error bit data PF<127:0> is greater than 0 (i.e., if the error bit data PF<127:0> includes at least one error bit), the bit data S<0> is set to HIGH.

On the other hand, if the number of error bits in the error bit data PF<127:0> is 0 (i.e., if there is no error bit in the error bit data PF<127:0>), the bit Data S<0> is set to LOW.

(Case 1) Skip the above operations from time t2 to time t8:

At time t1, in addition to the aforementioned operations, all of the bit data S<6> to S<1> are set to LOW. Therefore, computation time can be reduced.

Since the bit data S<6> is LOW, the logic level of the bit data Sd<0> is the same as that of the bit data S<0>. In addition, since the bit data S<6>~S<1> are LOW, each bit data Sd<6>~Sd<1> of the data Sd<6:1> turn LOW.

Since addition is not performed in the adding-one adder 391, the data Sd<6:1> is bit-expanded as the corrected error bit number SS<7:0>.

Therefore, if the number of error bits in the error bit data PF<127:0> is greater than 0 (i.e., if the error bit data PF<127:0> includes at least one error bit), the corrected error bit number SS<7:0> indicates 1. If the number of error bits in the error bit data PF<127:0> is 0 (i.e., if the error bit data PF<127:0> includes no error bit), the corrected error bit number SS<7:0> indicates 0.

(Case 2) Skip the above operation from time t2 to time t7, but execute the operation at time t8:

At time t1, in addition to the above-mentioned operation, all of the bit data S<6>~S<1> are set to LOW. Therefore, computation time can be reduced.

Since the bit data S<6> is LOW, the logic level of the bit data Sd<0> is the same as the bit data S<0>. In addition, since the bit data S<6>~S<1> are LOW, the bit data Sd<6>~Sd<1> of the data Sd<6:1> become LOW.

Here, unlike Case 1, at time t8, a plus-one calculation based on an XOR operation on the inputs of the error bit data PF<127:0> and the bit data Sd<0> is performed.

When the number of error bits in the error bit data PF<127:0> is an even number above 1, the bit data Sd<0> is HIGH. Because an odd number of data inputs 129 with levels of HIGH input the XOR gate 397, OEMatch turns HIGH. The adding-one adder 391 performs plus-one operation (i.e., 1+1) and bit expansion. The corrected error bit number SS<7:0> thus indicates 2.

When the number of error bits in the error bit data PF<127:0> is an odd number above 1, Sd<0> is HIGH. Because an even number of data inputs 129 with levels of HIGH input the XOR gate 397, OEMatch turns LOW.

Therefore, the adding-one adder 391 does not perform plus-one operation (i.e., performs 1+0) but performs bit expansion. The corrected error bit number SS<7:0> thus indicates 1.

When the number of error bits in the error bit data PF<127:0> is 0, the bit data Sd<0> is LOW. Since the 129-input XOR gate 397 has no input data without levels of LOW, OEMatch turns LOW. Therefore, the adding-one adder 391 does not perform plus-one operation (i.e., performs 1+0) but performs bit expansion. The corrected error bit number SS<7:0> thus indicates 1.

Second Embodiment

Figure 16:
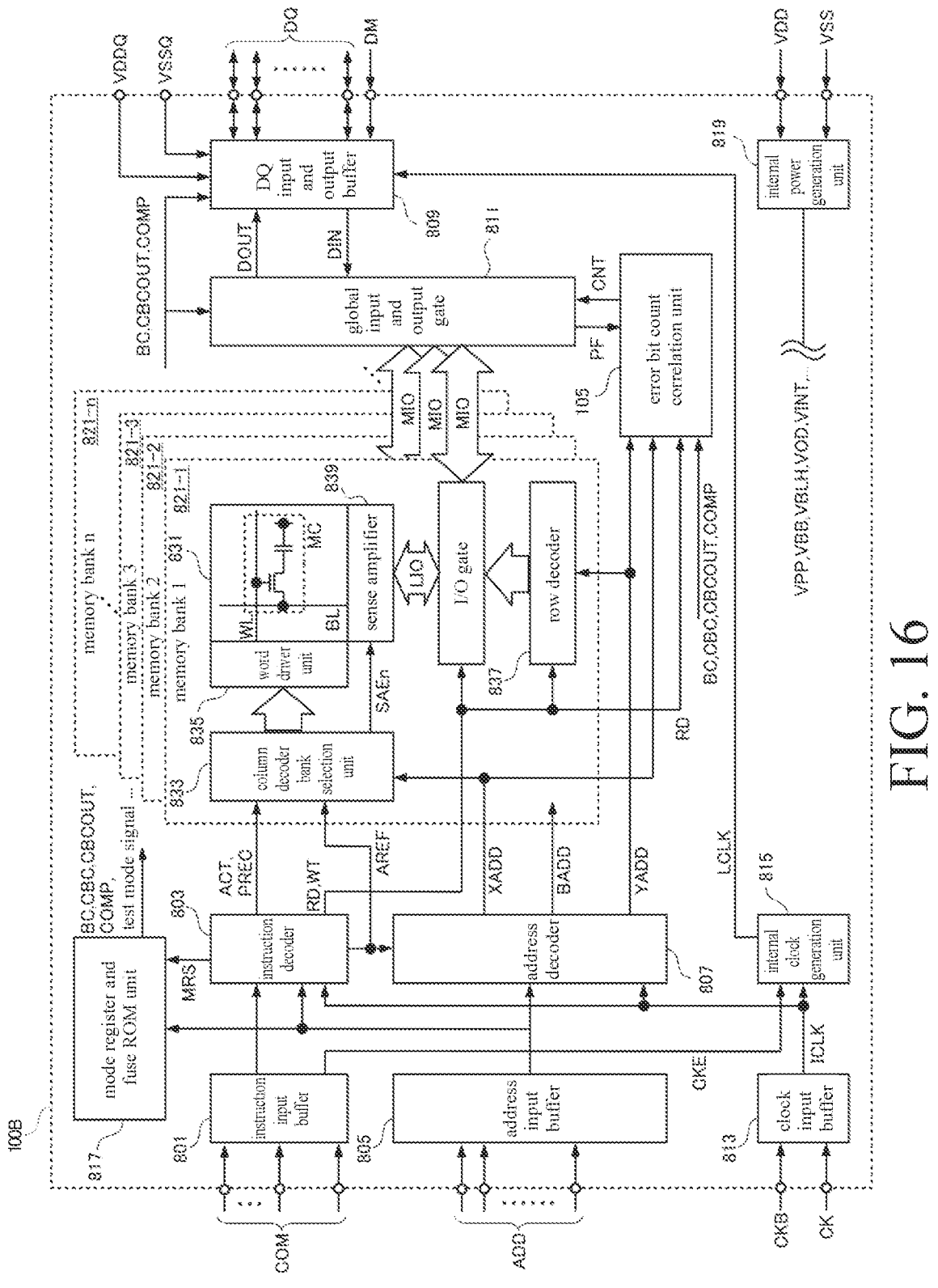
FIG. 16 is a block diagram illustrating a semiconductor memory device according to the second embodiment of the present invention.

FIG. 16 is a block diagram illustrating a semiconductor memory device 100B according to the second embodiment of the present invention. The semiconductor memory device 100B is a dynamic memory.

According to the semiconductor memory device 100A of the first embodiment, the error bit detection unit 201 included in the first half error bit count correlation unit 101 that is set in the memory bank 821-i (i=1, 2, 3 . . . , n) corresponds to one memory bank 821-i. In addition, the error bit detection unit 201 sets the error bit generated in the corresponding memory bank 821-i as a measurement object.

Here, in the semiconductor memory device 100B of the second embodiment, the error bit detection unit 201 included in an error bit count correlation unit 105 that is set outside the memory bank 821-i (i=1, 2, 3 . . . , n) corresponds to a plurality of memory banks 821-i. In addition, the error bit detection unit 201B sets the error bits generated in the corresponding plurality of memory banks 821-1 to 821-n as measurement objects.

Figure 17:
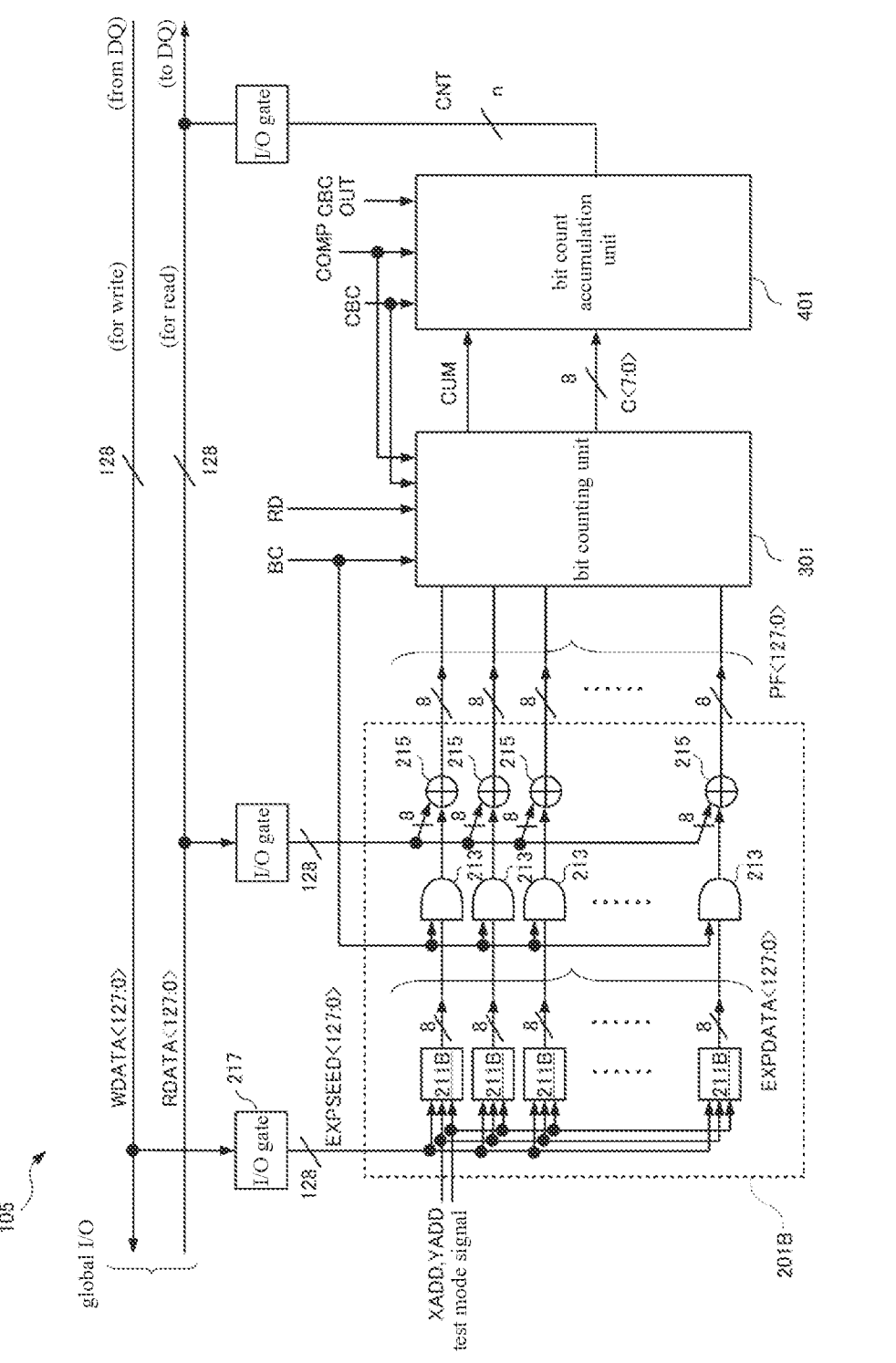
FIG. 17 is a circuit diagram illustrating a structure of the error bit count correlation unit shown in FIG. 16.

FIG. 17 is a circuit diagram illustrating a structure of the error bit count correlation unit 105 shown in FIG. 16.

Referring to FIG. 17, the error bit count correlation unit 105 includes an error bit detection unit 201B, a bit counting unit 301, and a bit count accumulation unit 401.

The bit counting unit 301 and the bit count accumulation unit 401 included in the error bit count correlation unit 105 are the same as those included in the second half error bit count correlation unit 103 of the semiconductor memory device 100A according to the first embodiment.

The error bit detection unit 201B has the same basic structure as the error bit detection unit 201 included in the second half error bit count association unit 103 of the semiconductor memory device 100A according to the first embodiment, but there are some differences.

It is similar to the first embodiment that the error bit detection unit 201B includes 16 XOR gate groups 215. Each XOR gate group 215 includes eight 2-input-1-output XOR gates.

In addition, it is similar to the first embodiment that the error bit detection unit 201B includes 16 AND gate groups 213. Each of the AND gate groups 213 includes eight 2-input-1-output AND gates.

Furthermore, it is different from the first embodiment that the error bit detection unit 201B includes 16 data scramble and latch circuits 211B.

Although the 128-bit write data WDATA is provided to the 16 data scramble and latch circuits 211B through the I/O gate 217 as the expected seed data EXPSEED<127:0>, the expected seed data EXPSEED<127:0> is divided into 16 groups at this time, each of which is 8 bits. The nth data scramble and latch circuit 211B (n=0~6) generates expected data EXPDATA<n+7:n> based on the 8-bit expected seed data EXPSEED<n+7:n> included in the each group. The 8 bits included in the expected data EXPDATA<n+7:n> are provided to an input terminal of each AND gate included in the corresponding AND gate group 213.

When instructed by the test mode signal, each data scramble and latch circuit 211B enables data scrambling on the expected seed data EXPSEED<n+7:n> according to the column address XADD and the row address YADD. Enabling data scrambling by the test mode signal, the data scramble and latch circuit 211B keeps or inverts the logic level of each bit in the seed data EXPSEED<n+7:n> according to the combination of the column address XADD and the row address YADD as the expected data EXPDATA<n+7: n>.

In addition, when not instructed by the test mode signal, each data scramble and latch circuit 211B does not enable data scrambling.

Therefore, each data scramble and latch circuit 211B performs data scrambling on the expected seed data EXPSEED<127:0> according to the combination of the column address XADD and the row address YADD in order to obtain the expected data EXPDATA<127:0> when instructed by the test mode signal. However, when not instructed by the test mode signal, each data scramble and latch circuit 211B does not perform data scrambling on the expected seed data EXPSEED<127:0> and directly output it as the write data WDATA<127:0>. Even in the second embodiment, it is the same as the first embodiment that the data output from the data scramble and latch circuit 211B is regarded as the expected data EXPDATA<127:0>, whether the data scrambling is performed or not.

Totally 128 bits of the expected data EXPDATA<127:0> output from the data scramble and latch circuit 211B are provided to the first input terminals of all AND gates in the AND gate group 213.

In addition, the control signal BC whose logic level turns HIGH in the error bit counting mode is providing to the first input terminals of all AND gates included in all of the AND gate groups 213.

The output terminal of each AND gate included in each AND gate group 213 is included in the corresponding XOR gate group 215, and is provided to the second input terminal of the corresponding XOR gate.

The 128-bit read data RDATA<127:0> is divided into 16 groups, each of which is 8 bits. Each bit RDATA<8 m+i> (where i=0~7) in each group of 8-bit read data RDATA<8 m+7:8 m> (where m=0~15) is provided to the second input terminal of each XOR gate included in each XOR gate group 215.

Therefore, in the error bit counting mode, each bit of the 128-bit expected data EXPDATA<127:0> and that of the 128-bit read data RDATA<127:0> of the 16 XOR gate groups 215 can be confirmed their consistency one by one. When the signal BC is HIGH, each bit of the error bit data PF<127:0>, which is composed of the output of the 16 XOR gate groups 215, can indicate the consistency between the logic level of the 128-bit expected data EXPDATA<127:0> and that of the 128-bit read data RDATA<127:0> bit by bit. That is, the bit data PF<i> (i=0~127) in the PF<127:0> indicates that there is consistency between the bit data EXPDATA<i> in the expected data EXPDATA<127:0> and the bit data RDATA<i> in the read data RDATA<127:0>. The inconsistent bits between the expected data EXPDATA<127:0> and the read data RDATA<127:0> are regarded as error bits.

In addition, in order to detect error bits, the write data WDATA to be written into a specific bit cell of a specific address of the memory is usually compared with the read data RDATA read from the cell. Therefore, during the detection of the error bit, bits of the read data RDATA should correctly correspond to corresponding bits of the write data WDATA in each XOR gate of the each XOR group 215. The data scramble and latch circuit 211 is controlled to correctly compare the bits of the read data RDATA and the corresponding bits of the write data WDATA in the XOR gate like this. In other words, the data scramble and latch circuit 211 is controlled so that the bit address and the bit combination of the expected data EXPDATA, which is converted from the read data RDATA, are consistent with those of the write data WDATA in clock. The read data RDATA is data input to the second terminal of each XOR gate included in the XOR gate group 215. The write data WDATA is data input to the first terminal of each XOR gate included in the XOR gate group 215.

Therefore, the data scramble and latch circuit 211 delays and outputs the write data WDATA for an appropriate time as the expected data EXPDATA to be compared with the read data RDATA.

The error bit data PF<127:0> output from the error bit detection unit 201B is provided to the bit counting unit 301.

Each of the embodiments described above is intended to make the present invention easy to understand, and the above description is not intended to limit the present invention. Therefore, each element disclosed in the above embodiments is intended to include all design changes or equivalents that fall within the technical scope of the present invention.

For example, in each of the above embodiments, a dynamic memory of a semiconductor memory device is used as an example for description, but the present invention is not limited to this case. For example, the semiconductor memory device may be a static memory or a ferroelectric random access memory (FRAM).

For another example, in the above embodiments, although the binary search method is used as an example of the search method for description, the present invention is not limited to this case. For example, a linear search method can also be used as the search method. Even in this case, similar to the binary search method, it is possible to have an error in the bit comparison unit and the error can be corrected by the bit correction unit.

In addition, even the number of error bits is 64 or more, the error bit data PF<127:0> can be used as the measurement object data A<127:0>. At this time, the bit comparison unit 341 is bit-expanded so that the uncorrected error bit number S<7:0> can be output. Next, the uncorrected error bit number S<7:0> is directly used as the intermediate error bit number Sd<7:0>, which is bit-expanded from the intermediate error bit number Sd<6:0>. That is, the buffer 393 and all the XOR gates 395 are omitted. The adding-one adder 391 is expanded so that the intermediate error bit number Sd<6:0> can be input to output the corrected data <7:0>. Next, when the parity of the error bit data PF<127:0> is inconsistent with the intermediate error bit number Sd<7:0> (specifically, the intermediate error bit number Sd<7:0> is only 1 less than the error bit data PF<127:0>), the expanded adding-one adder adds 1 to the intermediate error bit number Sd<7:0> to obtain the corrected error bit number SS<7:0>.

In addition, in the embodiments described above, although it is described that each data has a specific number of bits, the present invention is not limited to this case. Bit numbers can also have other values. There is no limit on the number of bits, the number of columns, rows and gates of a memory cell, the number of gate inputs, the number of stages in an adder, the number of gates in an adder, the number of gates in a circuit block, the number of latch circuits in a latch circuit group, the number of input bits of a bit counting differential amplifier, etc. These numbers can be changed appropriately according to the data.

Furthermore, in the above embodiments, although the expected data EXPDATA<127:0> prepared in the expected data preparation unit (data scramble and latch circuit 211) (i.e., the expected data EXPDATA<127:0> is generated in the semiconductor memory device 100A) is described as an example, but the present invention is not limited to this case. For example, when the expected data EXPDATA<127:0> is input externally, the first half error bit count correlation unit 101 or the error bit count correlation unit 105 of the semiconductor memory device 100A can also be configured to obtain the input expected data EXPDATA<127:0>.

What is claimed is:

1. A semiconductor memory device, comprising:
an error bit detection unit, configured to detect whether each bit in read data and each bit in expected data of the semiconductor memory device are consistent, and configured to output error bit data that provides pass/error information, wherein each bit of the pass/error information is generated by a respective bitwise comparison circuit that receives one bit of the expected data and a corresponding bit of the read data, thereby causing each bit position of the pass/error information to indicate, on a one-to-one basis, whether a corresponding detected bit of the read data is consistent with the expected data; and
a bit counting unit, configured to count a number of error bits in the error bit data that indicates that the read data and the expected data are inconsistent, or a number of pass bits in the error bit data that indicates that the read data and the expected data are consistent.

2. The semiconductor memory device as claimed in claim 1, wherein the error bit detection unit comprises:
XOR gate groups, configured to generate the error bit data by performing a XOR operation in bits on the read data and the expected data.

3. The semiconductor memory device as claimed in claim 2, further comprising:
an expected data preparation unit, configured to prepare write data corresponding to the read data as the expected data, wherein the write data is data written into the semiconductor memory device.

4. The semiconductor memory device as claimed in claim 3, wherein the expected data preparation unit inverts a logic level of a bit in the write data that is consistent with an inverted logic level of a bit in the read data as the expected data.

5. The semiconductor memory device as claimed in claim 3, wherein the expected data preparation unit latches the write data to compare the write data with the read data.

6. The semiconductor memory device as claimed in claim 1, wherein the bit counting unit further comprises:
a plurality of sub-error bit counters, each of which is configured to count a number of error bits in partial error bit data assigned to the sub-error bit counter itself among the error bit data, and to output a count value as a partial number of error bits; and
an adder, configured to add up the partial number of error bits to obtain the number of error bits.

7. The semiconductor memory device as claimed in claim 6, wherein each of the plurality of sub-error bit counters comprises:
a first block, configured to obtain a logical product of all bits in the partial error bit data assigned to the sub-error bit counter of the first block itself, and to output a bit indicating the logical product as a highest bit of binary data indicating the partial number of error bits;

a second block, configured to generate a voltage corresponding to the partial number of error bits that is assigned to the sub-error bit counter of the second block itself as a reference voltage;

a third block, configured to obtain a comparison result between the reference voltage and a voltage corresponding to a bit weight of the third block itself assigned to the binary data, and to output the comparison result as a second highest bit of the binary data indicating the partial number of error bits; and at least one fourth block, configured to obtain a comparison result of the reference voltage and a voltage determined by a value with one or more bits that are higher bits than a bit weight of the at least one fourth block itself assigned to the binary data and a bit of the at least one fourth block itself assigned to the binary data, and to output the comparison result as a bit assigned to the at least one fourth block itself, wherein the bit assigned to the at least one fourth block itself is a third highest bit of the binary data indicating the partial number of error bits.

8. The semiconductor memory device as claimed in claim 7, wherein each of the plurality of sub-error bit counters comprises:

a device, configured to stop operations of the third block and the at least one fourth block when a value of the highest bit of the binary data indicating the partial number of error bits is the same as a value obtained when the partial number of error bits is maximum.

9. The semiconductor memory device as claimed in claim 1, wherein the bit counting unit comprises:

a bit counting differential amplifier, configured to input each bit of measurement object data including a plurality of bits and each bit of reference data including a plurality of bits, and to output a determination result (magnitude data) indicating a magnitude relationship between a number of bits in the measurement object data with a first logic level and a number of bits in the reference data with the first logic level;

a measurement object data setting unit, configured to provide the error bit data as the measurement object data to the bit counting unit;

a reference data setting unit, configured to set logic levels of bits in a reference activation bit number among the plurality of bits in the reference data to the first logic level; and a calculation unit, wherein through a binary search algorithm and an output from the bit counting differential amplifier, the calculation unit is configured to make the reference activation bit number gradually change, and simultaneously to make the bit counting differential amplifier, the measurement object data setting unit, and the bit counting differential amplifier work to obtain the number of error bits from a plurality of magnitude data that are gradually output by the bit counting differential amplifier.

10. The semiconductor memory device as claimed in claim 9, wherein the bit counting unit further comprises:

a bit correction unit, configured to input the number of error bits obtained by the calculation unit as an uncorrected error bit number, wherein the uncorrected error bit number is directly output as a corrected error bit number if the uncorrected error bit number is the same as the number of error bits in the error bit data, else a number obtained by performing a correction operation on the uncorrected error bit number is output as the corrected error bit number.

11. The semiconductor memory device as claimed in claim 10, wherein the bit correction unit:

determines whether to execute the correction operation or not based on consistency/inconsistency between a parity of the uncorrected error bit number and a parity of the number of error bits included in the error bit data; and sets the corrected error bit number to a value that differs by only 1 from the uncorrected error bit number in the correction operation.

12. The semiconductor memory device as claimed in claim 9, wherein:

when the number of error bits included in the error bit data is more than a specific number, the measurement object data setting unit provides the uncorrected error bit number to the bit counting differential amplifier as the measurement object data, so that the number of error bits does not reach the specific number; and the calculation unit determines the number of error bits based on the specific number and a plurality of outputs that are sequentially output from the bit counting differential amplifier.

13. The semiconductor memory device as claimed in claim 9, wherein:

the bit counting unit outputs data indicating whether a number of bits in the error bit data with the first logic level is zero or greater than 1 based on a comparison result between the error bit data and the reference data with no bit of the first logical level.

14. The semiconductor memory device as claimed in claim 9, wherein:

the bit counting unit outputs data indicating whether the number of bits in the error bit data with the first logic level is zero or an even number greater than 1 or an odd number greater than 1 based on the comparison result between the error bit data and the reference data with no bit of the first logical level and a parity of the number of bits in the reference data with the first logic level.

15. The semiconductor memory device as claimed in claim 1, further comprising:

a plurality of memory banks, each of which includes the error bit detection unit;

wherein the bit counting unit is a unit that is external to the plurality of memory banks.

16. The semiconductor memory device as claimed in claim 1, comprising:

a plurality of memory banks;

wherein the bit detection unit and the bit counting unit are units external to the plurality of memory banks.

17. The semiconductor memory device as claimed in claim 1, wherein:

the bit counting unit further comprises a bit counting time generation unit and a bit counting tree unit, the bit counting time generation unit generates a signal for operating the bit counting tree unit, the bit counting tree unit inputs the error bit data, and outputs a determined error bit number.

18. The semiconductor memory device as claimed in claim 17, wherein:

the bit counting tree unit is configured to count a number of error bits having a predetermined logic level in the error bit data, and to output the determined error bit number in binary.

19. A semiconductor memory device, comprising:

an error bit detection unit, configured to detect whether each bit in read data and each bit in expected data of the semiconductor memory device are consistent, and configured to output error bit data that provides pass/error information, wherein the pass/error information indicates whether each detected bit is consistent;

a bit counting unit, configured to count a number of error bits in the error bit data that indicates that the read data and the expected data are inconsistent, or a number of pass bits in the error bit data that indicates that the read data and the expected data are consistent; and a bit counting differential amplifier, configured to input each bit of measurement object data including a plurality of bits and each bit of reference data including a plurality of bits, and to output a determination result (magnitude data) indicating a magnitude relationship between a number of bits in the measurement object data with a first logic level and a number of bits in the reference data with the first logic level.

20. The semiconductor memory device as claimed in claim 19, wherein:

a measurement object data setting unit, configured to provide the error bit data as the measurement object data to the bit counting unit;

a reference data setting unit, configured to set logic levels of bits in a reference activation bit number among the plurality of bits in the reference data to the first logic level; and a calculation unit, wherein through a binary search algorithm and an output from the bit counting differential amplifier, the calculation unit is configured to make the reference activation bit number gradually change, and simultaneously to make the bit counting differential amplifier, the measurement object data setting unit, and the bit counting differential amplifier work to obtain the number of error bits from a plurality of magnitude data that are gradually output by the bit counting differential amplifier.

* * * * *